United States Patent
Hirai et al.

(10) Patent No.: US 10,433,417 B2
(45) Date of Patent: Oct. 1, 2019

(54) ELECTRONIC APPARATUS

(71) Applicant: CANON KABUSHIKI KAISHA, Tokyo (JP)

(72) Inventors: Koji Hirai, Yokohama (JP); Yasuhito Tatara, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/422,342

(22) Filed: Feb. 1, 2017

(65) Prior Publication Data
US 2017/0231084 A1  Aug. 10, 2017

(30) Foreign Application Priority Data

Feb. 8, 2016  (JP) ................................ 2016-022100
Feb. 8, 2016  (JP) ................................ 2016-022186

(51) Int. Cl.
*H05K 1/00*  (2006.01)
*H05K 1/02*  (2006.01)
(Continued)

(52) U.S. Cl.
CPC ........... *H05K 1/0216* (2013.01); *H05K 1/181* (2013.01); *H05K 9/0028* (2013.01); *H05K 1/0243* (2013.01); *H05K 2201/1031* (2013.01); *H05K 2201/10371* (2013.01); *H05K 2201/10409* (2013.01); *H05K 2201/10522* (2013.01)

(58) Field of Classification Search
CPC ..... H01L 23/50; H01L 23/642; H01L 23/647; H01L 2924/0002; H05K 1/0227; H05K 1/0231; H05K 1/0234; H05K 2201/09318; H05K 1/0216; H05K 1/181; H05K 9/0028; H05K 1/0243; H05K 2201/1031; H05K 2201/10371; H05K 2201/10409; H05K 2201/10522
See application file for complete search history.

(56) References Cited

U.S. PATENT DOCUMENTS 5,838,551 A * 11/1998 Chan ..................... H01L 23/552
  361/818
7,626,825 B2 * 12/2009 Takamatsu ........... G02B 6/4201
  174/254

(Continued)

FOREIGN PATENT DOCUMENTS

JP  11-298182 A  10/1999

*Primary Examiner* — Pete T Lee
(74) *Attorney, Agent, or Firm* — Canon U.S.A.Inc., IP Division

(57) ABSTRACT

An electronic apparatus includes a conductive member and a printed circuit board, wherein the printed circuit board includes a printed wiring board having a signal wiring formed thereon, a first semiconductor device configured to output a digital signal to the signal wiring, and a second semiconductor device configured to input the digital signal output from the first semiconductor device via the signal wiring, wherein the signal wiring has a signal wiring pattern formed on a surficial layer located opposite the conductive member in the printed wiring board, and wherein the conductive member has an aperture formed therein and located opposite the signal wiring pattern or includes a flat plate portion and a recessed portion recessed in a direction more away from the printed wiring board than the flat plate portion.

26 Claims, 20 Drawing Sheets

(51) Int. Cl.
*H05K 1/18* (2006.01)
*H05K 9/00* (2006.01)

(56) References Cited

U.S. PATENT DOCUMENTS

| | | | |
|---|---|---|---|
| 8,013,258 B2* | 9/2011 | Wu | H01Q 1/526 |
| | | | 174/382 |
| 2003/0025191 A1* | 2/2003 | Takeoka | G01R 31/318538 |
| | | | 257/700 |

* cited by examiner

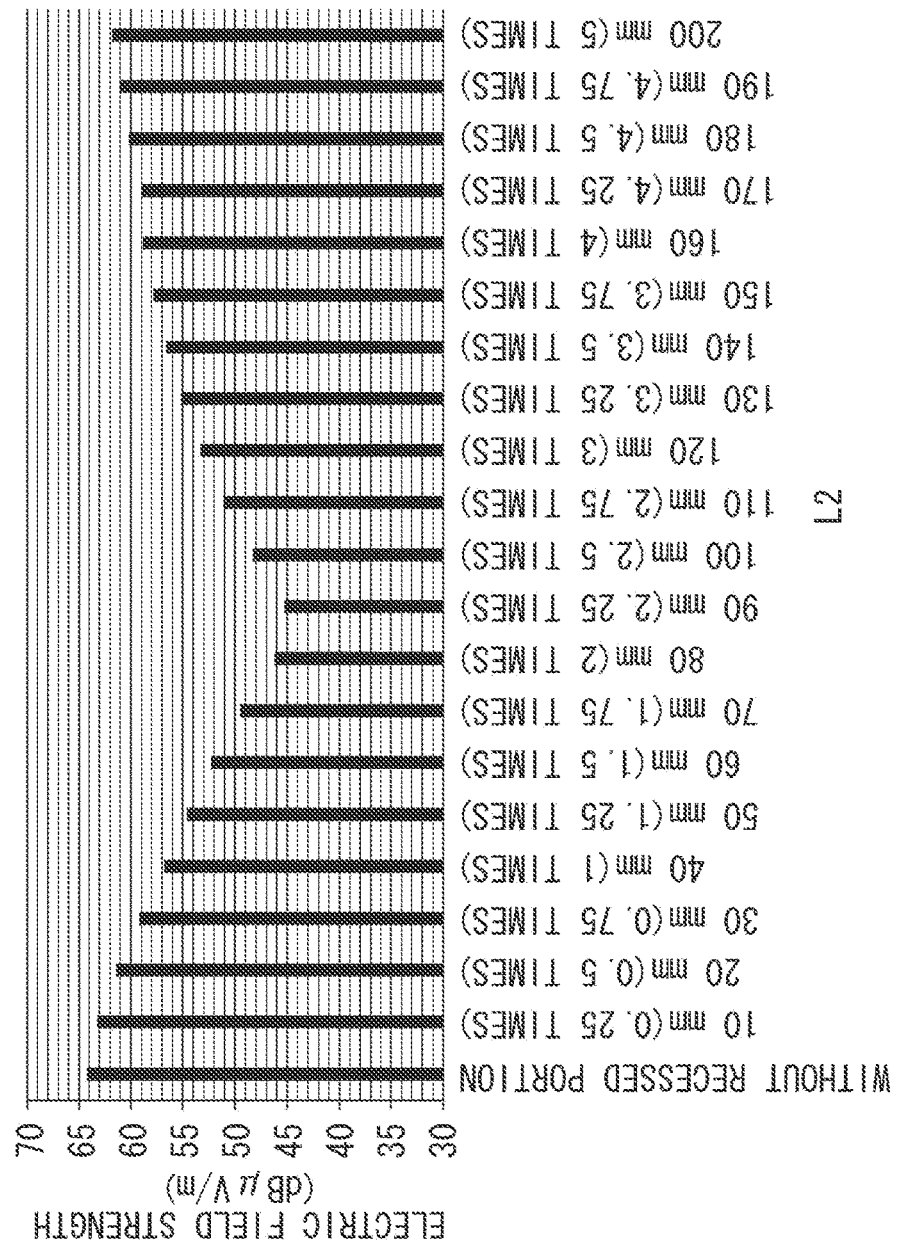

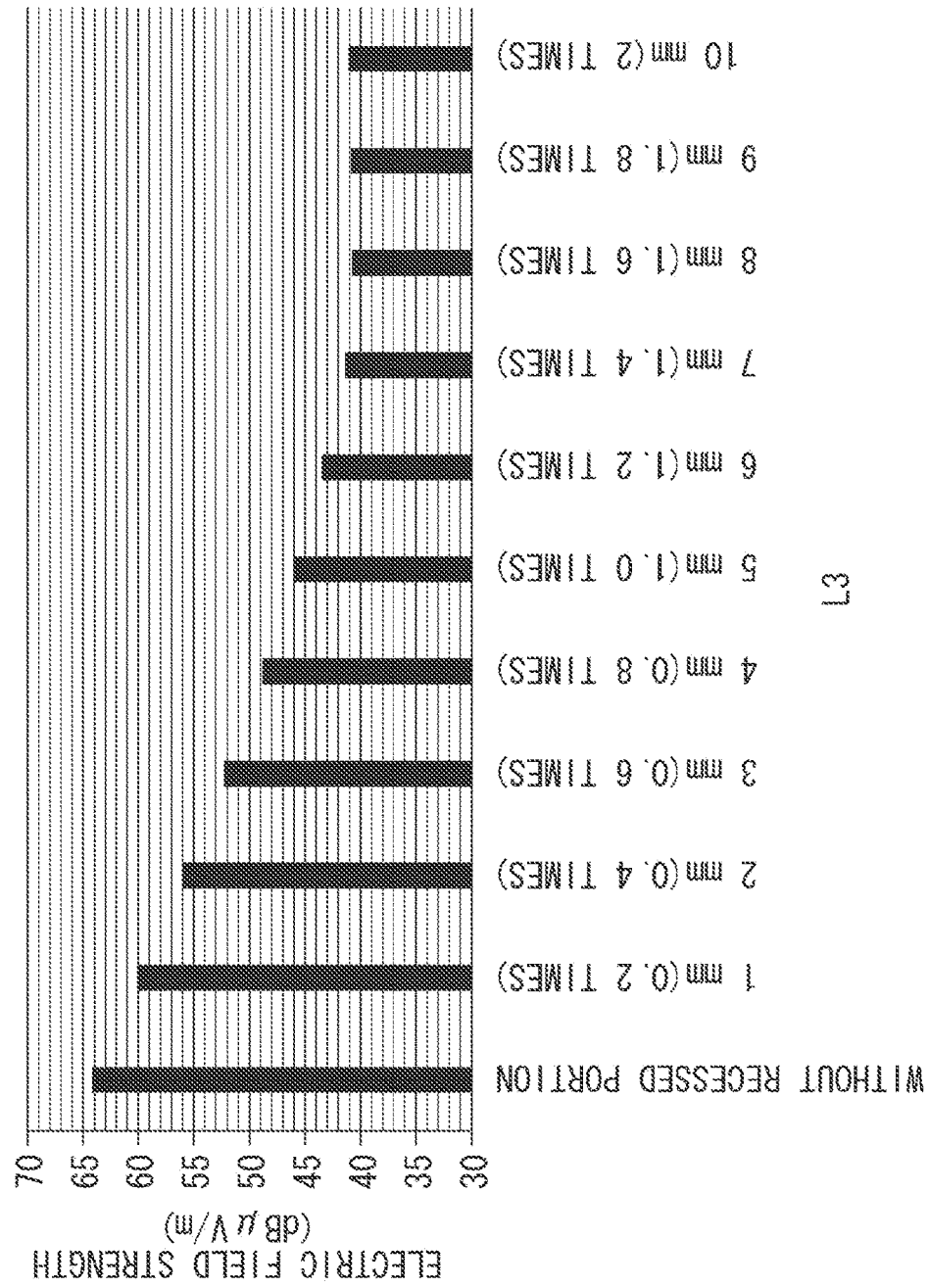

ELECTRONIC APPARATUS

BACKGROUND OF THE INVENTION

Field of the Invention

Aspects of the present disclosure generally relate to an electronic apparatus having a printed circuit board fixed to a conductive member.

Description of the Related Art

A large-scaled electronic apparatus, such as a copying machine, is configured with, for example, a conductive member (chassis) for retaining rigidity, printed circuit boards in which a semiconductor device, such as a central processing unit (CPU), for performing apparatus control is mounted on a printed wiring board, and cables used for signal transmission between the printed circuit boards, as discussed in Japanese Patent Application Laid-Open No. 11-298182.

In a structure discussed in Japanese Patent Application Laid-Open No. 11-298182, a printed circuit board is conductively connected and fixed to a conductive chassis via a conductive spacer. More specifically, the printed circuit board is fixed to a flat plate portion of the conductive chassis for the purposes of positional fixing and rigidity retention of the printed circuit board, stabilization of ground potential of the printed circuit board, reduction of electromagnetic wave noise occurring in the printed circuit board, and reduction of the influence of external noise on the printed circuit board.

However, in the structure discussed in Japanese Patent Application Laid-Open No. 11-298182, in which the printed circuit board and the conductive member are located opposite each other, resonance of an electromagnetic wave occurring between the printed circuit board and the conductive member may cause radiation of strong electromagnetic wave noise in a certain specific frequency.

SUMMARY OF THE INVENTION

Aspects of the present disclosure are generally directed to reducing radiation of electromagnetic wave noise occurring due to a resonance between a printed circuit board and a conductive member.

According to an aspect of the present disclosure, an electronic apparatus includes a conductive member and a printed circuit board, wherein the printed circuit board includes a printed wiring board having a signal wiring formed thereon, a first semiconductor device configured to output a digital signal to the signal wiring, and a second semiconductor device configured to input the digital signal output from the first semiconductor device via the signal wiring, wherein the signal wiring has a signal wiring pattern formed on a surficial layer located opposite the conductive member in the printed wiring board, and wherein the conductive member has an aperture formed therein and located opposite the signal wiring pattern.

Further features of the present disclosure will become apparent from the following description of exemplary embodiments with reference to the attached drawings.

BRIEF DESCRIPTION OF THE DRAWINGS

FIG. 12B is a graph indicating a simulation result of electric field strength of electromagnetic wave noise in a case where the length L2 of the recessed portion has been changed in Example 4. FIG. 12C is a graph indicating a simulation result of electric field strength of electromagnetic wave noise in a case where the length L3 of the recessed portion has been changed in Example 4.

DESCRIPTION OF THE EMBODIMENTS

Various exemplary embodiments, features, and aspects of the disclosure will be described in detail below with reference to the drawings.

Figure 1A:
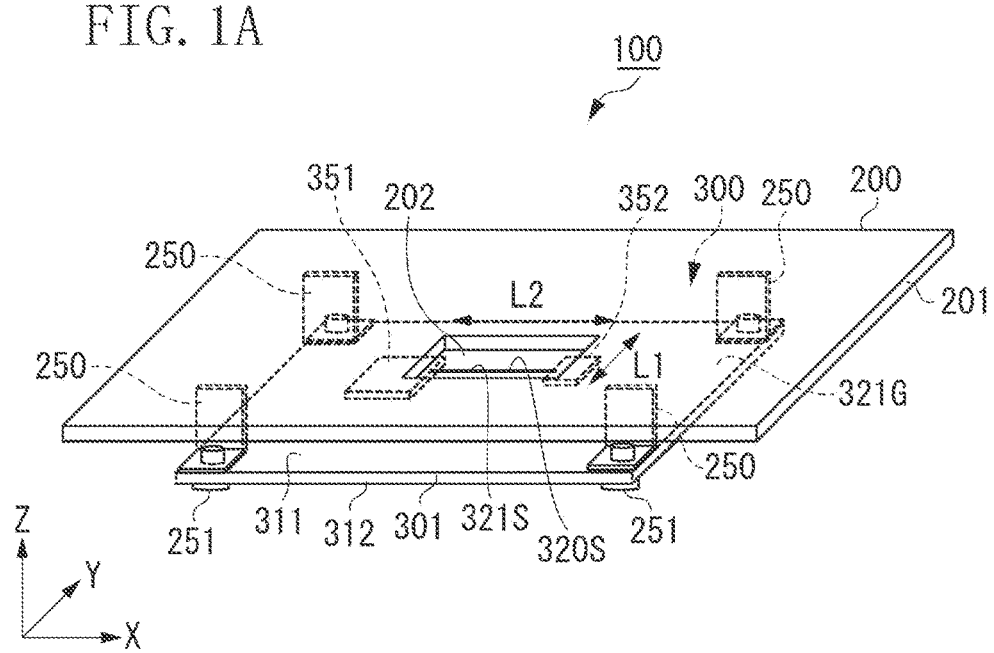
FIG. 1A is a perspective view illustrating a part of an electronic apparatus according to a first exemplary embodiment.
Figure 1B:
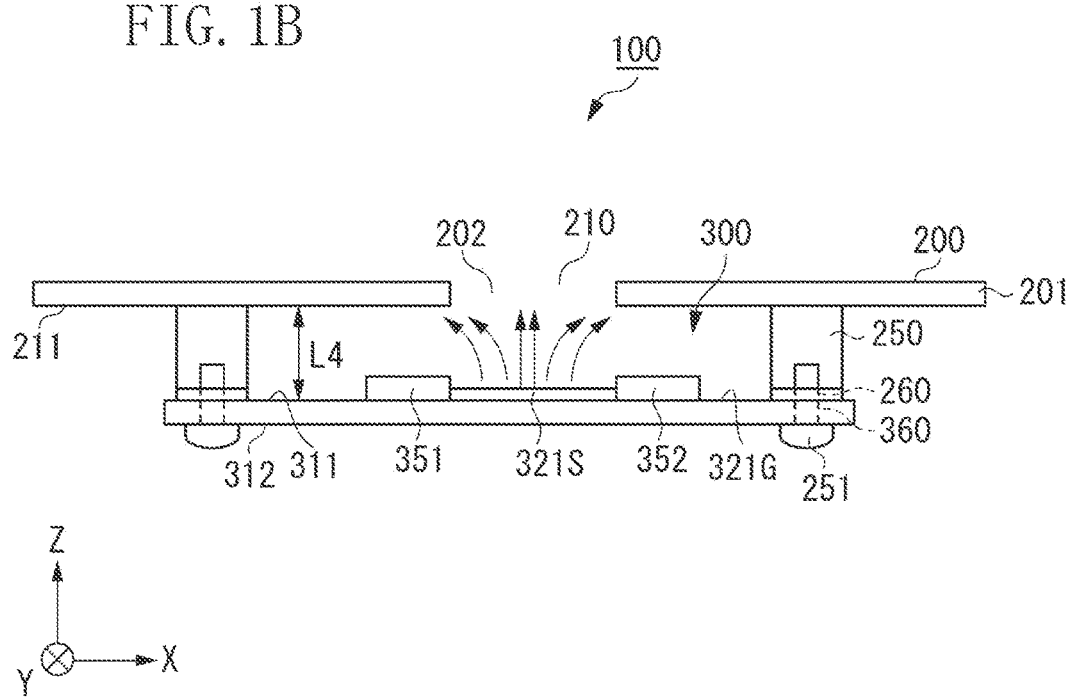
FIG. 1B is a sectional view illustrating a part of the electronic apparatus according to the first exemplary embodiment.

FIG. 1A is a perspective view illustrating a part of an electronic apparatus according to a first exemplary embodiment. FIG. 1B is a sectional view illustrating a part of the electronic apparatus according to the first exemplary embodiment. The electronic apparatus 100 is, for example, an image forming apparatus, such as a copying machine, and FIGS. 1A and 1B illustrate a control unit and its surrounding portion of the image forming apparatus.

The electronic apparatus 100 includes a chassis 200 made from metal, which is a conductive member, and a printed circuit board 300, which is located opposite the chassis 200 across a space and is fixed to the chassis 200 via spacers (rising portions) 250, which are conductive (metallic) connection members. More specifically, the chassis 200 has a flat plate portion 201, which is a flat plate-like member, and the printed circuit board 300 is connected to the flat plate portion 201. The printed circuit board 300 is connected to another printed circuit board (not illustrated) by a cable, so that transmission and reception of digital signals can be performed between the printed circuit boards via the cable. In the first exemplary embodiment, the spacers 250 are integrally attached to the chassis 200 (the flat plate portion 201).

The chassis 200 is arranged inside the electronic apparatus 100 for the purposes of positional fixing and rigidity retention of the printed circuit board 300, stabilization of ground potential of the printed circuit board 300, reduction of electromagnetic wave noise occurring in the printed circuit board 300, and reduction of the influence of external noise on the printed circuit board 300.

The printed circuit board 300 includes a printed wiring board 301, a semiconductor device (integrated circuit (IC)) 351, which is a first semiconductor device, mounted on the printed wiring board 301, and a semiconductor device (IC) 352, which is a second semiconductor device, mounted on the printed wiring board 301. The semiconductor device 351 transmits a digital signal to the semiconductor device 352, and the semiconductor device 352 receives a digital signal transmitted from the semiconductor device 351 to operate.

The printed wiring board 301 is a printed wiring board configured with two or more layers, which include a pair of surficial layers 311 and 312. The semiconductor devices 351 and 352 are mounted on one surficial layer 311 of the printed wiring board 301. The surficial layer 311 is a surficial layer located at the side opposite (fixed to) the chassis 200 (the flat plate portion 201).

The printed wiring board 301 has a signal wiring 320S formed thereon, which is used for connecting a signal terminal (output terminal) of the semiconductor device 351 and a signal terminal (input terminal) of the semiconductor device 352 and serves as a transmission path for digital signals.

The semiconductor device 351 includes an output circuit that outputs a digital signal, specifically, a clock signal, to the signal wiring 320S, and the semiconductor device 352 includes an input circuit that inputs a signal output from the semiconductor device 351 to the signal wiring 320S.

A signal wiring pattern 321S, which constitutes the signal wiring 320S, and a ground pattern 321G, which constitutes a ground wiring, are formed on the surficial layer 311. Furthermore, although not illustrated, a power-supply wiring pattern, which constitutes a power-supply wiring, is also formed on the surficial layer 311.

In the first exemplary embodiment, the entirety of the signal wiring 320S is the signal wiring pattern 321S formed on the surficial layer 311. Then, the signal wiring pattern 321S is formed to extend in a linear fashion.

Here, a direction which is a direction of tangent to the surface (surficial layer) 311 of the printed wiring board 301 and a wiring direction in which the signal wiring pattern 321S extends (a direction parallel to the wiring direction) is defined as the X-direction. A direction which is a direction of tangent to the surface 311 of the printed wiring board 301 and a direction perpendicular to the X-direction is defined as the Y-direction. A direction normal to the surface 311 of the printed wiring board 301 is defined as the Z-direction.

The four corners of the printed wiring board 301 are fixed to the spacers 250 by conductive screws 251. More specifically, through-holes 360 formed on the printed wiring board 301 and screw holes 260 formed on the spacers 250 are accorded with each other to enable fixing by the screws 251.

Ground patterns 321G are formed at least at the four corners of the surficial layer 311 of the printed wiring board 301, and the ground patterns 321G are electrically connected to the chassis 200 by the spacers 250. In other words, the printed circuit board 300 is grounded via the chassis 200 by the spacers 250.

Figure 18A:
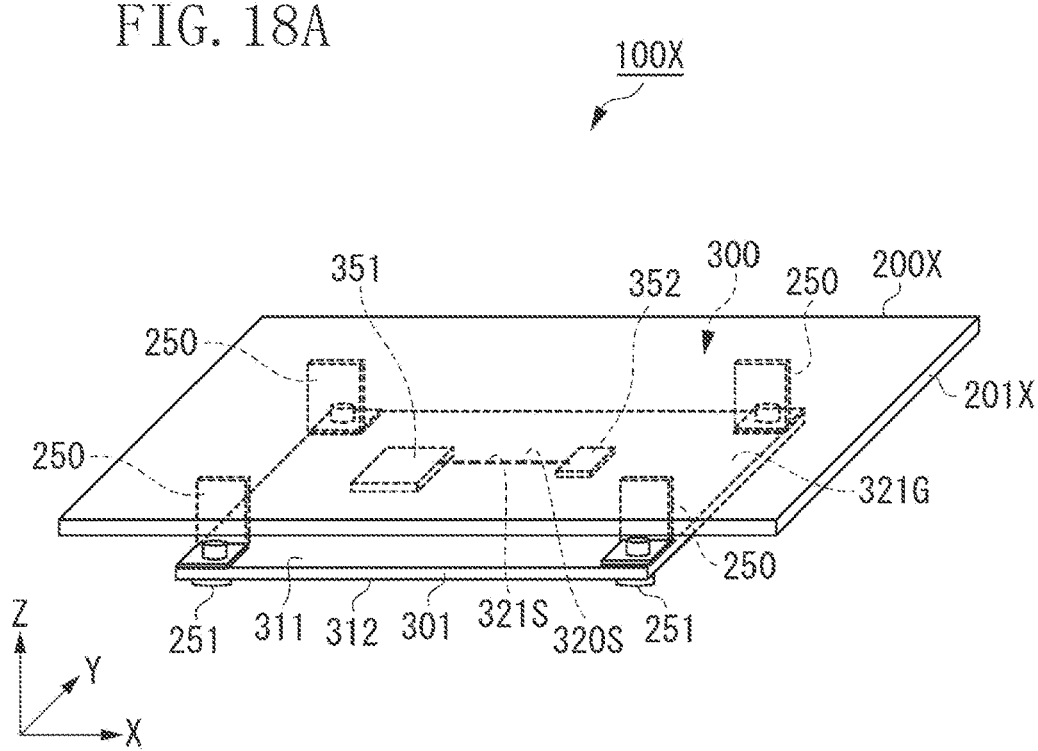
FIG. 18A is a perspective view illustrating a part of an electronic apparatus according to the comparative example.
Figure 18B:
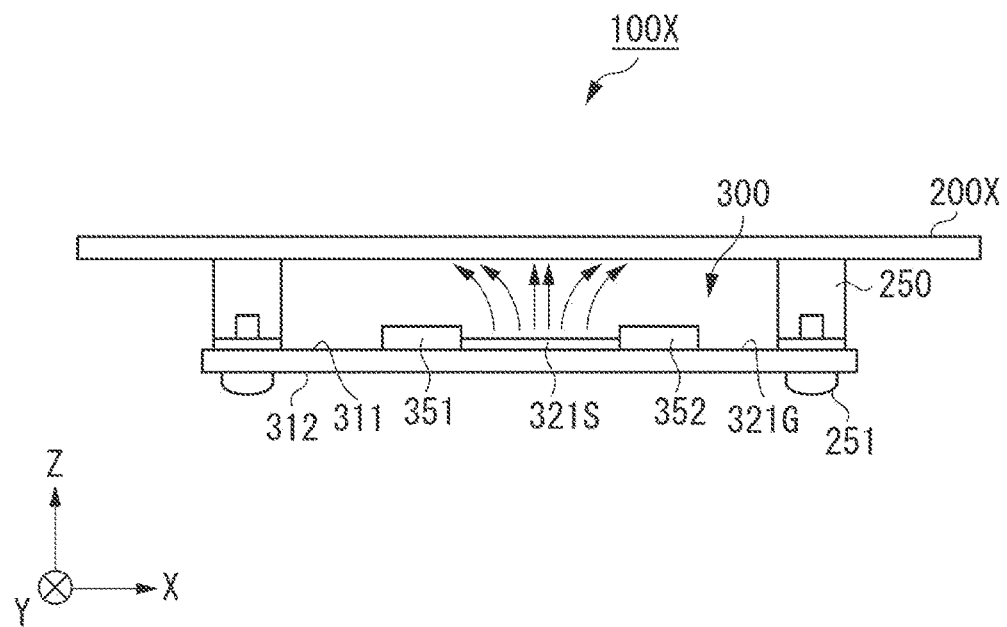
FIG. 18B is a sectional view illustrating a part of the electronic apparatus according to the comparative example.

Here, an electronic apparatus according to a comparative example is described. FIG. 18A is a perspective view illustrating a part of the electronic apparatus according to the comparative example. FIG. 18B is a sectional view illustrating a part of the electronic apparatus according to the comparative example.

The electronic apparatus 100X according to the comparative example differs from the electronic apparatus 100 according to the first exemplary embodiment in the structure of a chassis. The other constituent elements are similar to those of the first exemplary embodiment. A conductive chassis 200X is configured with a flat plate portion 201X, which is a flat plate-like member. An aperture (also referred to as an opening), which is a through-hole located opposite the signal wiring pattern 321S, is not formed on the flat plate portion 201X. The printed circuit board 300 is fixed to the flat plate portion 201X via the spacers 250.

An opposite relationship structure between the flat plate portion 201X and the ground pattern 321G on the surficial layer 311 of the printed wiring board 301 causes resonance. If electromagnetic wave noise is supplied to the opposite relationship structure, the resonant frequency causes radiation of strong electromagnetic wave noise.

In particular, in a case where a clock signal is transferred through the signal wiring pattern 321S, a harmonic component of the clock signal causes electromagnetic field coupling as indicated by arrows in FIG. 18B at a portion of the flat plate portion 201X near and opposite the signal wiring pattern 321S. As a result, the harmonic component of the clock signal spreads while propagating along the flat plate portion 201X and is thus supplied to the opposite relationship structure between the flat plate portion 201X and the printed wiring board 301. Then, strong electromagnetic wave noise is radiated in a frequency that occurs as a result of superposition of the harmonic component of the clock signal and the resonant frequency of the opposite relationship structure.

Therefore, the flat plate portion 201 of the chassis 200 according to the first exemplary embodiment has an aperture forming portion 210, which is located opposite the signal wiring pattern 321S and in which an aperture (also referred to as an opening) 202 serving as a through-hole is formed.

In the first exemplary embodiment, a single aperture 202 is formed in the aperture forming portion 210. Since only one aperture 202 is formed in the aperture forming portion 210, the aperture 202 and the aperture forming portion 210 have the same size.

The four corners of the printed wiring board 301 are fixed to the flat plate portion 201 via the spacers 250. The aperture 202 (the aperture forming portion 210) has a size encompassing a part or the whole, desirably the whole, of the signal wiring pattern 321S as viewed from the direction of a normal line to the surface 311 of the printed wiring board 301 (the Z-direction).

Although electromagnetic wave noise of a harmonic component of the clock signal is radiated from the signal wiring pattern 321S of the printed circuit board 300, the aperture 202 of the chassis 200 causes electromagnetic field coupling to the chassis 200 to become smaller than that in the case of the comparative example in which the aperture 202 is not provided.

Therefore, the amount of a harmonic component of the clock signal spreading and propagating along the flat plate portion 201 decreases, and radiation of electromagnetic wave noise caused by resonance occurring between the printed wiring board 301 and the chassis 200 is reduced. In this way, since the aperture 202 is provided in the chassis 200, a uniform opposite relationship structure between the printed wiring board 301 and the chassis 200 is collapsed and the resonance is reduced, and, as a result, the amount of radiation of electromagnetic wave noise in the resonant frequency decreases.

In other words, although the total energy of electromagnetic wave noise radiated from the signal wiring pattern 321S does not decrease, the peak of electric field strength of electromagnetic wave noise occurring due to a resonance between the printed circuit board 300 and the chassis 200 can be reduced. Accordingly, the radiation of electromagnetic wave noise caused by resonance can be reduced, and the influence of electromagnetic wave noise on another electronic apparatus can be reduced.

Moreover, since the peak of electric field strength of radiated electromagnetic wave noise decreases, the printed circuit board 300 does not need to be covered with a shield box. Then, instead of a shield box, wiring of a cable connected to the printed circuit board 300 (the printed wiring board 301) becomes easy, and assembly also becomes easy.

Furthermore, while, in the first exemplary embodiment, a case in which the signal wiring pattern 321S is in a linear fashion has been described, a signal wiring pattern having a bent portion can also be employed. In that case, the aperture can be of a shape obtained by projecting the bent shape of the signal wiring pattern.

Moreover, while, in the first exemplary embodiment, a case in which the digital signal propagating through the signal wiring 320S is a clock signal has been described, this is not limiting. While, in the case of a clock signal, the peak of electric field strength of electromagnetic wave noise can be effectively reduced, even in the case of a digital signal other than the clock signal, for example, a digital signal serving as a control signal or a data signal, the peak of electric field strength of electromagnetic wave noise can also be reduced.

Example 1

A result of the simulated electromagnetic field calculation of electric field strength occurring at the opposite relationship structure between the printed circuit board 300 and the chassis 200 at 3 m distant position is shown to confirm the above-described function effect.

As software for electromagnetic field simulation, MW-STUDIO produced by CST Corporation was used. The flat plate portion 201 was a conductive flat plate, 310 mm long (in the X-direction) and 230 mm wide (in the Y-direction). The printed wiring board 301, 300 mm long and 210 mm wide, was located under the flat plate portion 201. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

As a noise source, a Gaussian pulse of 1 V was set in place of the semiconductor device 351 for outputting a digital signal, and a resistor of 1 MΩ was set in place of the semiconductor device 352 for inputting a digital signal. The aperture 202 was an aperture formed in a rectangle shape as viewed from the Z-direction.

The size of the aperture 202 was set to L1=30 mm and L2=50 mm, where the length in the Y-direction was denoted by L1 and the length in the X-direction was denoted by L2.

Figure 2:
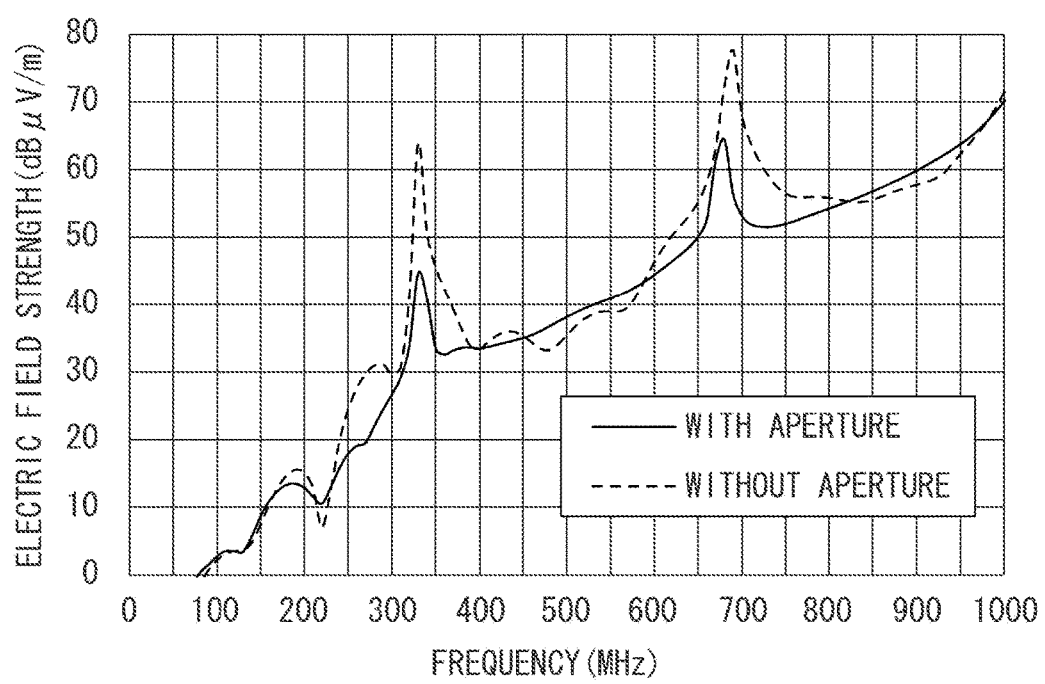
FIG. 2 is a graph indicating a simulation result of electric field strength in Example 1 and a comparative example.

FIG. 2 is a graph indicating a simulation result of electric field strength in Example 1 and the comparative example. The graph illustrated in FIG. 2 indicates a simulation result of electric field strength at a position 3 m distant from the printed circuit board 300. The abscissa axis indicates frequency, and the ordinate axis indicates electric field strength. Furthermore, in the comparative example, except for the absence of an aperture, the same configuration as that of Example 1 was employed to perform simulation. In FIG. 2, a solid line indicates a simulation result of Example 1 (with an aperture), and a dashed line indicates a simulation result of the comparative example (without any aperture).

The calculation (simulation) result indicates that there are peaks of electric field strength at frequencies of 330 MHz and 690 MHz, as illustrated in FIG. 2. These are electric field strength peaks caused by resonance in the opposite relationship structure between the printed circuit board 300 (the printed wiring board 301) and the chassis 200. From FIG. 2, it is understood that the peak of electric field strength is lower and the amount of radiation of electromagnetic wave noise is smaller in Example 1 (with an aperture) than in the comparative example (without any aperture).

Next, calculation (simulation) results in a case where the length L1 in the Y-direction and the length L2 in the X-direction of the aperture 202 were respectively changed are shown to confirm the effect of a decrease of the amount of radiation of electromagnetic wave noise depending on the size of the aperture 202.

Figure 3A:
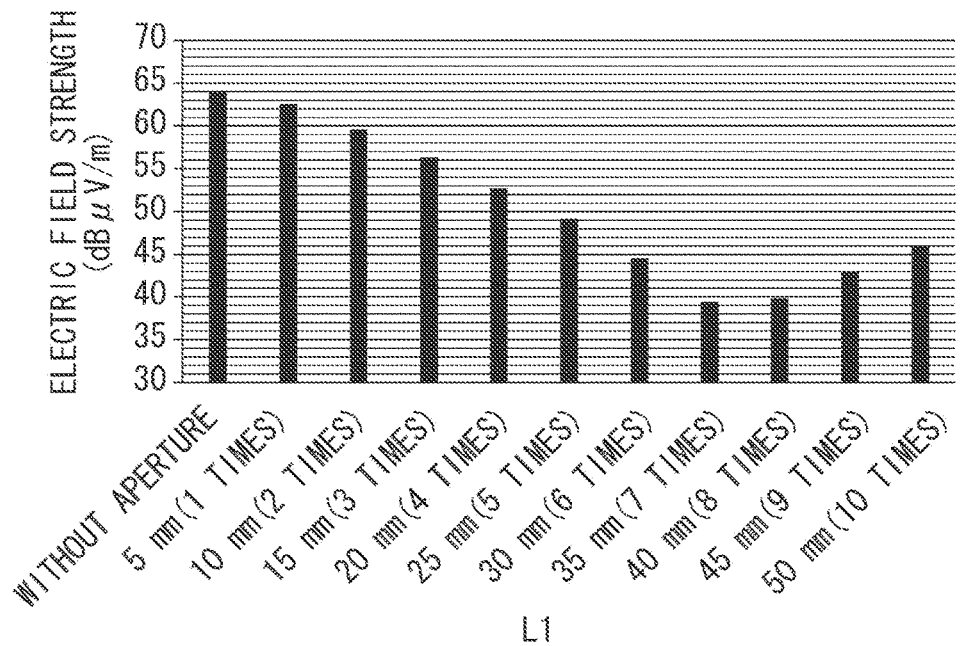
FIG. 3A is a graph indicating a simulation result of electric field strength of electromagnetic wave noise in a case where the length L1 of an aperture has been changed in Example 1.

First, a result of calculation in a case where the length L1 of the aperture 202 was changed is illustrated in FIG. 3A. FIG. 3A is a graph illustrating a simulation result of electric field strength of electromagnetic wave noise in a case where the length L1 of the aperture 202 was changed in Example 1. The graph illustrated in FIG. 3A represents a comparison between peak values of electric field strength of electromagnetic wave noise occurring in the vicinity of 330 MHz, which is close to the basic frequency of the noise source and is a low frequency that is likely to present a problem.

The width of the signal wiring pattern 321S was set to 0.2 mm, and the distance L4 between the surface (surficial layer) 311 of the printed wiring board 301 and the flat plate portion 201 was set to 5 mm. The width of the signal wiring pattern 321S was so small as to be 1/25 or less of the distance L4. Therefore, without addition of 0.2 mm of the signal wiring width, the length L1 was changed to the respective multiples of the distance L4 (5 mm) between the printed wiring board 301 and the flat plate portion 201 of the chassis 200. The length L2 was fixed to 50 mm. Moreover, the length L1 of the aperture 202 was changed in the +Y-direction and in the −Y-direction from the position located opposite the central portion of the signal wiring pattern 321S.

When the length L1 was 1 times the distance L4 (5 mm), a noise reduction effect of about 1 dB was obtained. When the length L1 was 10 mm, which was 2 times the distance L4 (5 mm), a noise reduction effect of about 4 dB was obtained.

As the length L1 of the aperture 202 was changed to a greater value, when the length L1 was 35 mm and 40 mm, which were 7 times and 8 times the distance L4 (5 mm), the highest noise reduction effect, a noise reduction effect of about 24 dB, was obtained. Then, until the length L1 became 50 mm, which was 10 times the distance L4 (5 mm), a noise reduction effect of 3 dB or more was confirmed. However, as the length L1 is made longer, the leakage of electromagnetic wave noise other than the peak increases. Moreover, if the aperture 202 is made larger more than is necessary, the advantages of the conductive chassis 200, such as stabilization of ground potential of the printed circuit board 300 and prevention of the influence of external noise on the printed circuit board 300, become impaired. Therefore, from the viewpoint of a noise reduction effect, it is desirable that the aperture 202 have a length in the Y-direction obtained by adding the wiring width of the signal wiring pattern 321S to the length that is 2 times or more to 8 times or less the distance L4.

Figure 3B:
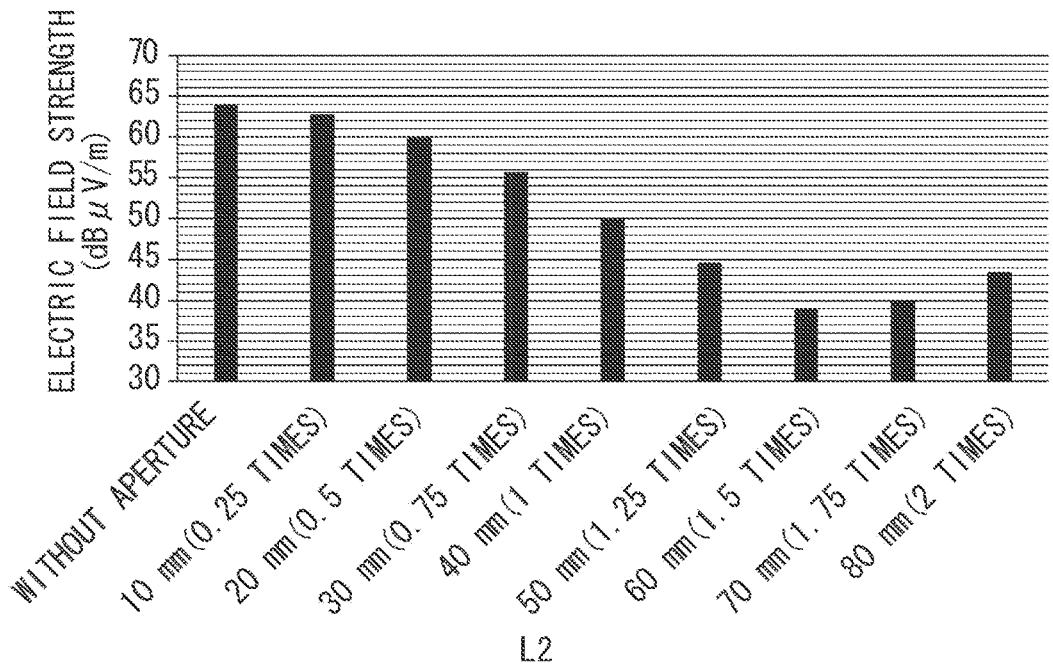
FIG. 3B is a graph indicating a simulation result of electric field strength of electromagnetic wave noise in a case where the length L2 of the aperture has been changed in Example 1.

Next, a result of calculation in a case where the length L2 of the aperture 202 was changed is illustrated in FIG. 3B. FIG. 3B is a graph illustrating a simulation result of electric field strength of electromagnetic wave noise in a case where the length L2 of the aperture 202 was changed in Example 1. The graph illustrated in FIG. 3B represents a comparison between peak values of electric field strength of electromagnetic wave noise occurring in the vicinity of 330 MHz, which is close to the basic frequency of the noise source and is a low frequency that is likely to present a problem. The length L1 was fixed to 30 mm. Moreover, the length L2 of the aperture 202 was changed in the −X-direction toward the semiconductor device 351 and in the +X-direction toward the semiconductor device 352 from the position located opposite the central portion of the signal wiring pattern 321S.

When the length L2 of the aperture 202 was 10 mm, which was 0.25 times the length 40 mm of the signal wiring pattern 321S, a noise reduction effect of about 1 dB was obtained, and, when the length L2 was 20 mm, which was 0.5 times, a noise reduction effect of about 4 dB was obtained.

As the length L2 of the aperture 202 was changed to a greater value, when the length L2 was 60 mm, which was 1.5 times the signal wiring length 40 mm, the highest noise reduction effect, a noise reduction effect of about 25 dB, was obtained. Then, until the length L2 became 80 mm, which was 2 times the signal wiring length, a noise reduction effect of 3 dB or more was confirmed.

However, as the length L2 is made longer, the leakage of electromagnetic wave noise other than the peak increases. Moreover, if the aperture 202 is made larger more than is necessary, the advantages of the conductive chassis 200, such as stabilization of ground potential of the printed circuit board 300 and prevention of the influence of external noise on the printed circuit board 300, become impaired. Therefore, from the viewpoint of a noise reduction effect, it is desirable that the length in the X-direction of the aperture 202 be 0.5 times or more to 1.5 times or less the length in the X-direction of the signal wiring pattern 321S.

More specifically, when the length L2 is 1 times the length in the X-direction of the signal wiring pattern 321S, the aperture 202 (the aperture forming portion 210) encompasses the whole of the signal wiring pattern 321S as viewed from the Z-direction. The aperture 202 encompassing the whole of the signal wiring pattern 321S, which serves as a radiation source of electromagnetic wave noise, as viewed from the Z-direction enables effectively reducing the amount of radiation of electromagnetic wave noise caused by resonance.

Moreover, from the viewpoint of blocking a noise radiation source, it is desirable that the aperture 202 (the aperture forming portion 210) does not encompass the semiconductor device 351 as viewed from the Z-direction. This enables preventing electromagnetic wave noise occurring at the semiconductor device 351 from leaking through the aperture 202.

Furthermore, with respect to the semiconductor device 352, which is a receiving side, it is also desirable that the aperture 202 (the aperture forming portion 210) does not encompass the semiconductor device 352 as viewed from the Z-direction. This enables reducing the amount of radiation of electromagnetic wave noise.

Example 2

In Example 1, with regard to the configuration of the electronic apparatus 100 according to the first exemplary embodiment, a simulation was performed in a case where a Gaussian pulse was set as a noise source in place of the semiconductor device 351. In Example 2, with regard to the configuration of the electronic apparatus 100 according to the first exemplary embodiment, a result of simulation performed in a case where the semiconductor device 351 output a clock signal is shown.

Figure 4A:
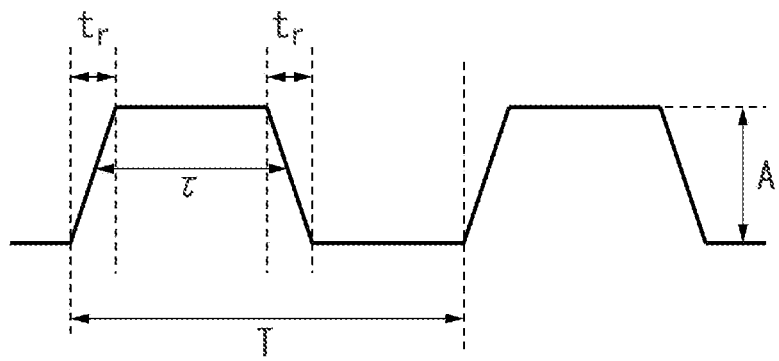
FIG. 4A is a waveform chart of a clock signal.
Figure 4B:
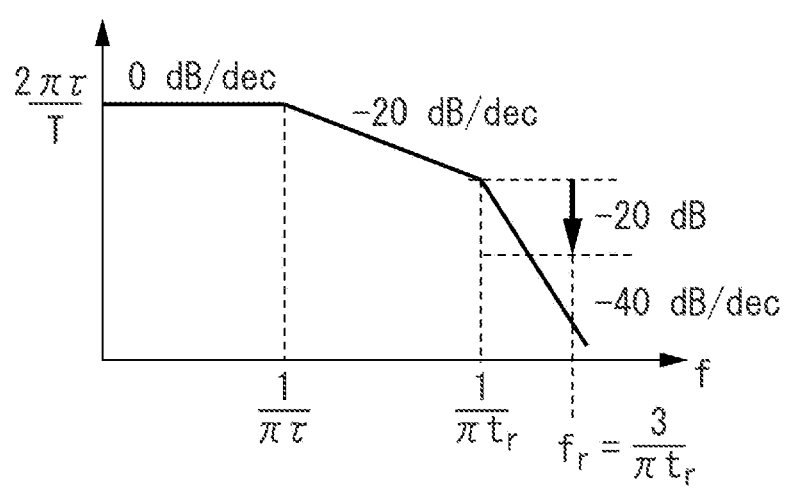
FIG. 4B is a graph indicating a frequency spectrum of the clock signal.

Here, the clock signal is described. FIG. 4A is a waveform chart of the clock signal, and FIG. 4B is a graph illustrating a frequency spectrum of the clock signal.

The clock signal is a trapezoidal wave. When the amplitude of the clock signal is denoted by A, the period thereof is denoted by T, the rise time thereof is denoted by $t_r$, and the pulse width thereof is denoted by $\tau$, their relationship with the frequency spectrum is as illustrated in FIGS. 4A and 4B.

Here, the lowest order resonant frequency caused by the opposite relationship structure between the printed circuit board 300 (the printed wiring board 301) and the chassis 200 is denoted by $f_r$. If the resonant frequency $f_r$ is present in a region in which a harmonic component of the clock signal output from a noise source is not sufficiently reduced, the risk of electromagnetic wave noise caused by resonance becoming larger is high, so that it is necessary to prevent electromagnetic field coupling from the signal wiring pattern 321S to the chassis 200.

Therefore, in a case where the resonant frequency $f_r$ is lower than the frequency at which the frequency spectrum reduces as much as 20 dB in a characteristic region of −40 dB/dec, the aperture 202 is formed in a region of the chassis 200 located opposite the signal wiring pattern 321S. The condition for that formation corresponds to the case where the rise time $t_r$ of the clock signal is in a relationship of $t_r < 3/(\pi \times f_r)$.

A result of the simulated calculation of electric field strength occurring at the opposite relationship structure between the printed circuit board 300 and the chassis 200 at 3 m distant position is shown to confirm the function effect for noise reduction.

As software for electromagnetic field simulation, MW-STUDIO produced by CST Corporation was used. The flat plate portion 201 was a conductive flat plate, 310 mm long and 230 mm wide. The printed wiring board 301, 300 mm long and 210 mm wide, was located under the flat plate portion 201. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

Here, the lowest order resonant frequency in this example was 330 MHz, and, according to calculation of $t_r<3/(\pi \times f_r)$, a clock signal of $t_r<2.9$ ns was set as a target signal wiring.

The semiconductor device 351 for outputting a digital signal was configured to output a trapezoidal waveform clock signal with an amplitude of 3.3 V, a frequency of 10 MHz, and a rise time of 1 ns. The semiconductor device 352 for inputting a digital signal was configured to have a resistance value of 1 MΩ. The aperture 202 was an aperture formed in a rectangle shape as viewed from the Z-direction.

The size of the aperture 202 was set to L1=30 mm and L2=50 mm, where the length in the Y-direction was denoted by L1 and the length in the X-direction was denoted by L2.

Figure 5:
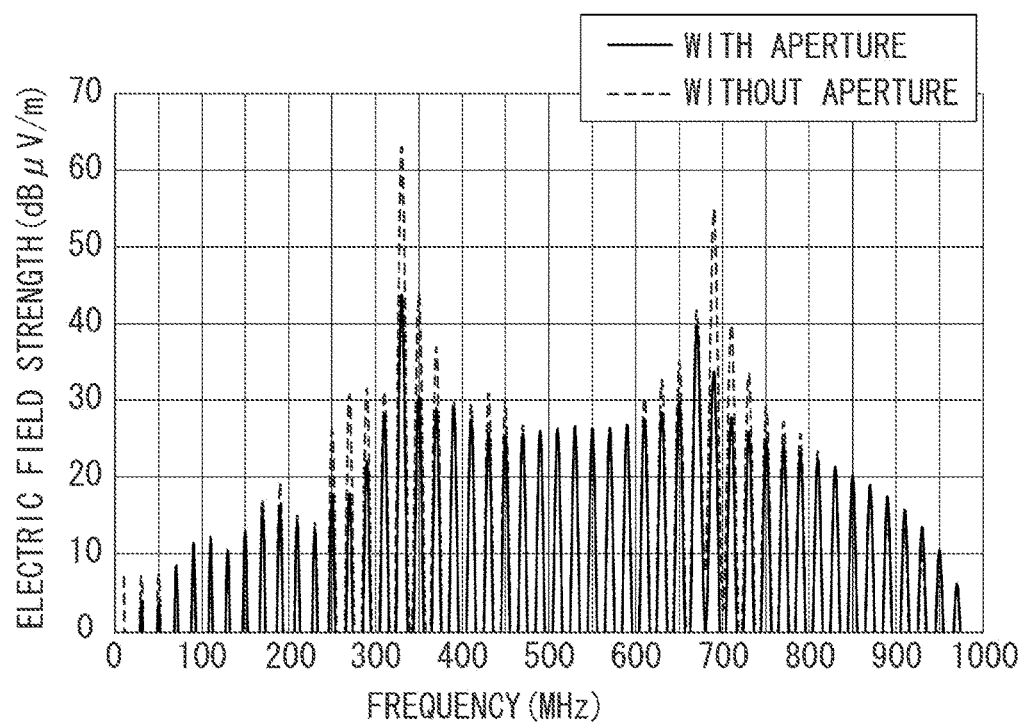
FIG. 5 is a graph indicating a simulation result of electric field strength in Example 2 and the comparative example.

FIG. 5 is a graph indicating a simulation result of electric field strength in Example 2 and the comparative example. The graph illustrated in FIG. 5 indicates a simulation result of electric field strength at a position 3 m distant from the printed circuit board 300. The abscissa axis indicates frequency, and the ordinate axis indicates electric field strength. In FIG. 5, a solid line indicates a simulation result of Example 2 (with an aperture), and a dashed line indicates a simulation result of the comparative example (without any aperture).

The calculation (simulation) result indicates that there are peaks of electric field strength at frequencies of 330 MHz and 690 MHz, as illustrated in FIG. 5. These are electric field strength peaks caused by resonance in the opposite relationship structure between the printed circuit board 300 (the printed wiring board 301) and the chassis 200.

In the low order resonant frequency of 330 MHz, since the aperture 202 is applied to the signal wiring pattern 321S, through which a clock signal with a short rise time (a clock signal of 10 MHz or more) propagates, the radiation of electromagnetic wave noise in a harmonic component of the clock signal can be reduced. Moreover, in the high order resonant frequency of 690 MHz, electromagnetic wave noise can also be reduced.

While, in a case where the frequency of a clock signal is 10 MHz or more, electromagnetic wave noise can be effectively reduced, for practical purposes, the frequency of a clock signal is 1 GHz or less. Accordingly, it is desirable that the frequency of a clock signal be 10 MHz or more to 1 GHz or less.

Figure 6A:
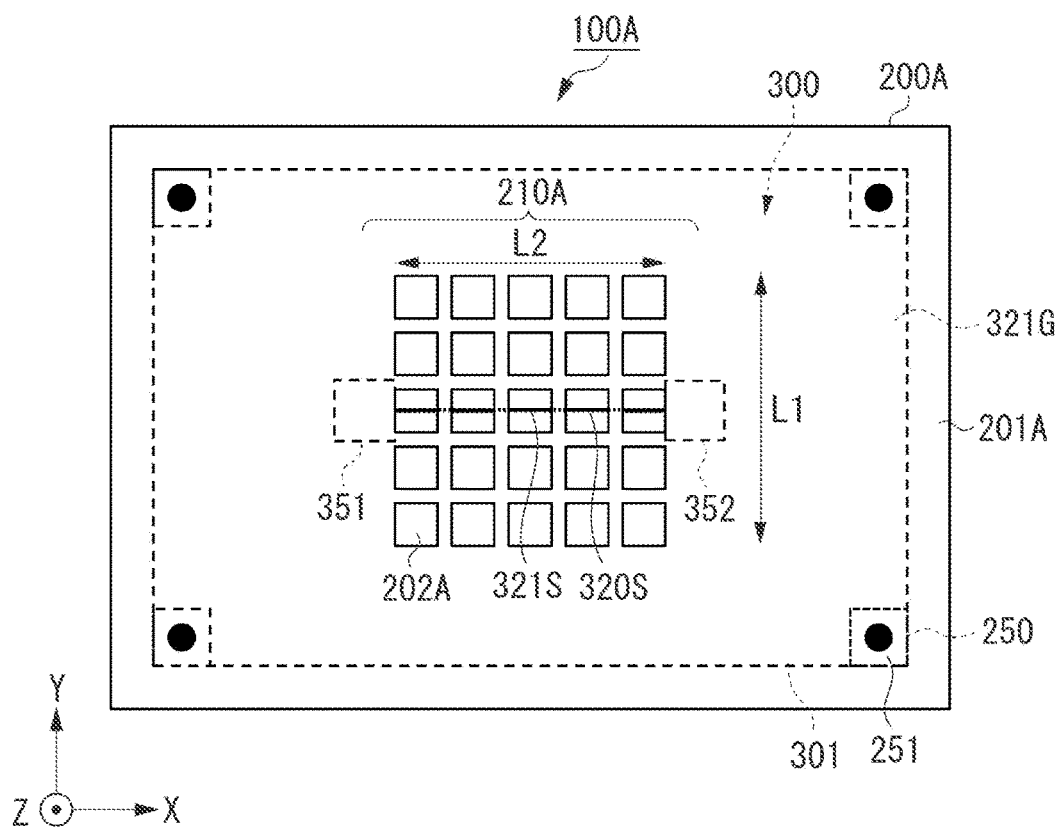
FIG. 6A is a plan view illustrating a part of an electronic apparatus according to a second exemplary embodiment.
Figure 6B:
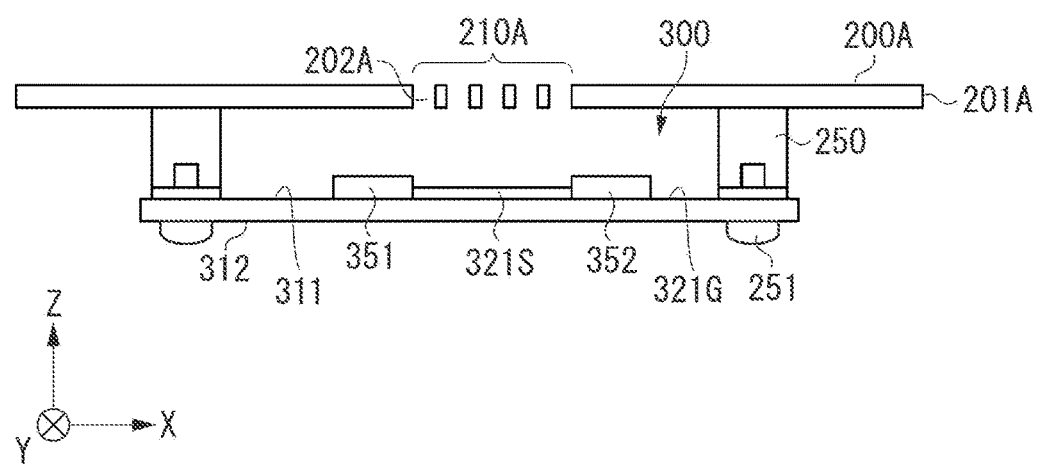
FIG. 6B is a sectional view illustrating a part of the electronic apparatus according to the second exemplary embodiment.

Next, an electronic apparatus according to a second exemplary embodiment is described. FIG. 6A is a plan view illustrating a part of the electronic apparatus according to the second exemplary embodiment. FIG. 6B is a sectional view illustrating a part of the electronic apparatus according to the second exemplary embodiment. In the second exemplary embodiment, the configuration of a chassis 200A, which is a conductive member, differs from that of the chassis 200 described in the first exemplary embodiment. The other configurations are similar to those of the first exemplary embodiment. Furthermore, in the second exemplary embodiment, the configurations similar to those of the first exemplary embodiment are omitted from the description.

The electronic apparatus 100A includes the chassis 200A made from metal, which is a conductive member, and the printed circuit board 300, which is located opposite the chassis 200A across a space and is fixed to the chassis 200A via the spacers 250. More specifically, the chassis 200A has a flat plate portion 201A, which is a flat plate-like member, and the printed circuit board 300 is connected to the flat plate portion 201A.

The flat plate portion 201A of the chassis 200A has an aperture forming portion 210A, which is located opposite the signal wiring pattern 321S and in which a plurality of apertures (also referred to as openings) 202A each serving as a through-hole is formed at intervals.

The aperture forming portion 210A is a convex polygon with a minimum area encompassing all of the apertures 202A as viewed from the Z-direction. In the second exemplary embodiment, each aperture 202A is formed in a rectangular shape as viewed from the Z-direction. Then, a plurality of apertures 202A is arrayed in a square lattice shape at intervals from each other. Accordingly, the aperture forming portion 210A has the shape of a quadrangle with a minimum area encompassing all of the apertures 202A as viewed from the Z-direction.

The aperture forming portion 210A has a size encompassing a part or the whole, desirably the whole, of the signal wiring pattern 321S as viewed from the direction of a normal line to the surface 311 of the printed wiring board 301 (the Z-direction).

Although electromagnetic wave noise of a harmonic component of the clock signal is radiated from the signal wiring pattern 321S of the printed circuit board 300, a plurality of apertures 202A of the chassis 200A causes electromagnetic field coupling to the chassis 200A to become smaller than that in the case of the comparative example in which the aperture 202A is not provided.

Therefore, the amount of a harmonic component of the clock signal spreading and propagating along the flat plate portion 201A decreases, and radiation of electromagnetic wave noise caused by resonance occurring between the printed wiring board 301 and the chassis 200A is reduced. In this way, since a plurality of apertures 202A is provided in the chassis 200A, a uniform opposite relationship structure between the printed wiring board 301 and the chassis 200A is collapsed and the resonance is reduced, and, as a result, the amount of radiation of electromagnetic wave noise in the resonant frequency decreases.

In other words, although the total energy of electromagnetic wave noise radiated from the signal wiring pattern 321S does not decrease, the peak of electric field strength of electromagnetic wave noise occurring due to a resonance between the printed circuit board 300 and the chassis 200A can be reduced. Accordingly, the radiation of electromagnetic wave noise caused by resonance can be reduced, and the influence of electromagnetic wave noise on another electronic apparatus can be reduced.

Moreover, since the peak of electric field strength of radiated electromagnetic wave noise decreases, the printed circuit board 300 does not need to be covered with a shield box. Then, instead of a shield box, wiring of a cable connected to the printed circuit board 300 (the printed wiring board 301) becomes easy, and assembly also becomes easy.

Moreover, since the aperture forming portion 210A, which is configured with a plurality of small-sized apertures 202A in combination, is arranged, the rigidity of the chassis 200A can be prevented from decreasing.

Furthermore, while, in the second exemplary embodiment, a case in which the signal wiring pattern 321S is in a linear fashion has been described, a signal wiring pattern having a bent portion can also be employed. In that case, the aperture forming portion can be of a shape obtained by projecting the bent shape of the signal wiring pattern.

Moreover, while, in the second exemplary embodiment, a case in which the digital signal propagating through the signal wiring 320S is a clock signal has been described, this is not limiting. While, in the case of a clock signal, the peak of electric field strength of electromagnetic wave noise can be effectively reduced, even in the case of a digital signal other than the clock signal, for example, a digital signal serving as a control signal or a data signal, the peak of electric field strength of electromagnetic wave noise can also be reduced.

Example 3

A result of the simulated electromagnetic field calculation of electric field strength occurring at the opposite relationship structure between the printed circuit board 300 and the chassis 200A at 3 m distant position is shown to confirm the above-described function effect.

As software for electromagnetic field simulation, MW-STUDIO produced by CST Corporation was used. The flat plate portion 201A was a conductive flat plate, 310 mm long and 230 mm wide. The printed wiring board 301, 300 mm long and 210 mm wide, was located under the flat plate portion 201A. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

As a noise source, a Gaussian pulse of 1 V was set in place of the semiconductor device 351 for outputting a digital signal, and a resistor of 1 MΩ was set in place of the semiconductor device 352 for inputting a digital signal. Each aperture 202A was an aperture formed in a square shape as viewed from the Z-direction, and the aperture forming portion 210A was of a square shape as viewed from the Z-direction.

More specifically, apertures 202A each in the shape of a square 10 mm on each side were arranged five by five at intervals of 1 mm. With this, the size of the aperture forming portion 210A was set to L1=54 mm and L2=54 mm, where the length in the Y-direction was denoted by L1 and the length in the X-direction was denoted by L2.

Figure 7:
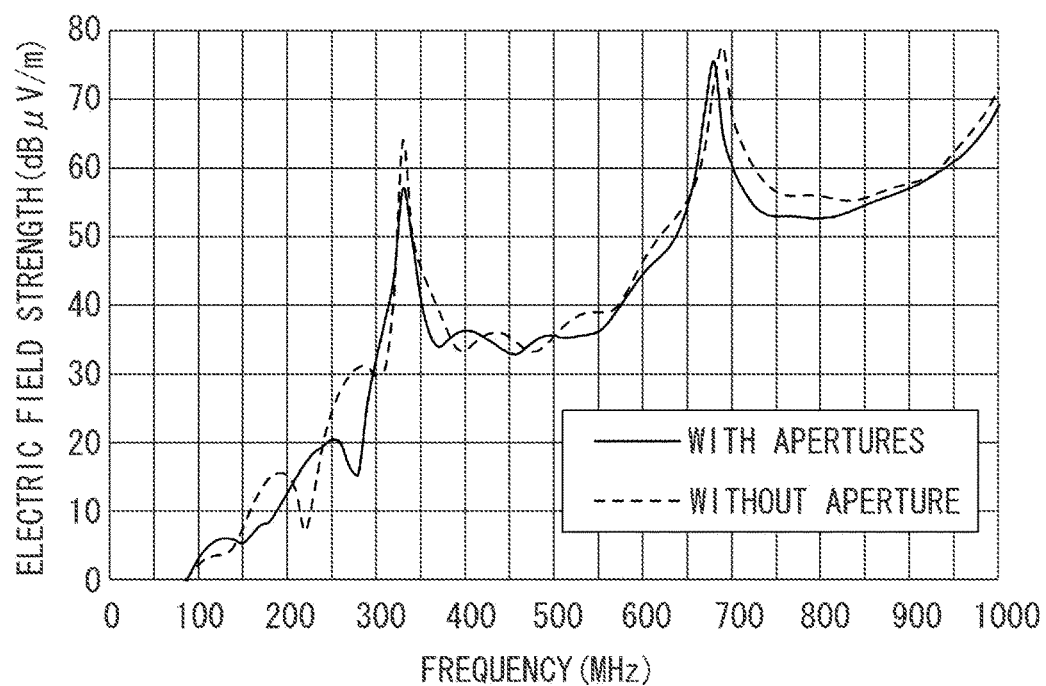
FIG. 7 is a graph indicating a simulation result of electric field strength in Example 3 and the comparative example.

FIG. 7 is a graph indicating a simulation result of electric field strength in Example 3 and the comparative example. The graph illustrated in FIG. 7 indicates a simulation result of electric field strength at a position 3 m distant from the printed circuit board 300. The abscissa axis indicates frequency, and the ordinate axis indicates electric field strength. In FIG. 7, a solid line indicates a simulation result of Example 3 (with apertures), and a dashed line indicates a simulation result of the comparative example (without any aperture).

The calculation (simulation) result indicates that there are peaks of electric field strength at frequencies of 330 MHz and 690 MHz, as illustrated in FIG. 7. These are electric field strength peaks caused by resonance in the opposite relationship structure between the printed circuit board 300 (the printed wiring board 301) and the chassis 200A. From FIG. 7, it is understood that the peak of electric field strength is lower and the amount of radiation of electromagnetic wave noise is smaller in Example 3 (with apertures) than in the comparative example (without any aperture).

Next, calculation (simulation) results in a case where the length L1 in the Y-direction and the length L2 in the X-direction of the aperture forming portion 210A were respectively changed are shown to confirm the effect of a decrease of the amount of radiation of electromagnetic wave noise depending on the size of the aperture forming portion 210A (i.e., apertures).

Figure 8A:
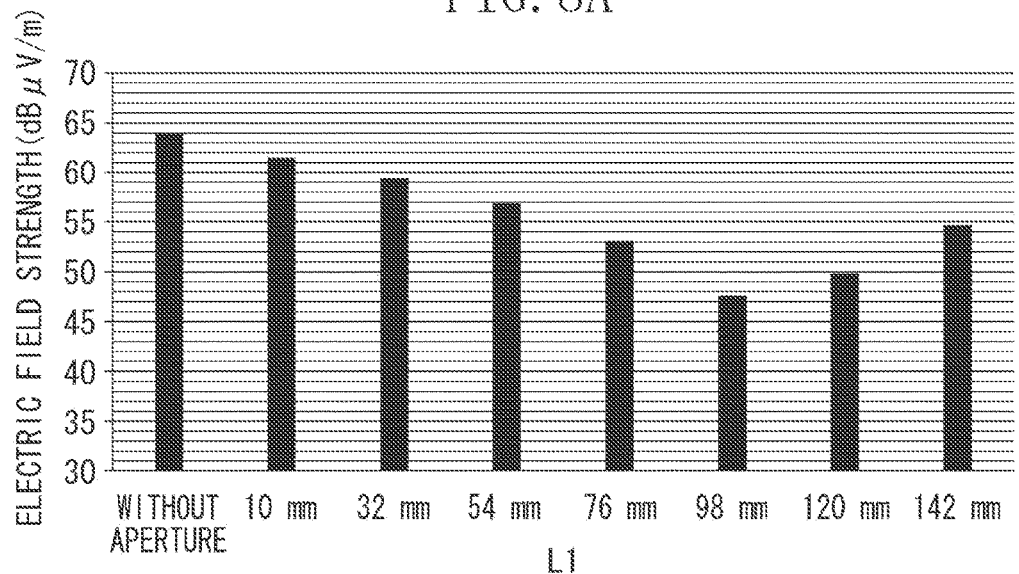
FIG. 8A is a graph indicating a simulation result of electric field strength of electromagnetic wave noise in a case where the length L1 of an aperture forming portion has been changed in Example 3.

First, a result of calculation in a case where the length L1 of the aperture forming portion 210A was changed is illustrated in FIG. 8A. FIG. 8A is a graph illustrating a simulation result of electric field strength of electromagnetic wave noise in a case where the length L1 of the aperture forming portion 210A was changed in Example 3. The graph illustrated in FIG. 8A represents a comparison between peak values of electric field strength of electromagnetic wave noise occurring in the vicinity of 330 MHz, which is close to the basic frequency of the noise source and is a low frequency that is likely to present a problem.

The width of the signal wiring pattern 321S was set to 0.2 mm, and one side of each aperture 202A was set to 10 mm. The width of the signal wiring pattern 321S was so small as to be 1/50 or less of one side of each aperture 202A. Therefore, without addition of 0.2 mm of the signal wiring width, the length L1 was changed by changing the number of arranged apertures 202A to odd numbers, such as 1, 3, 5, . . . , in sequence. The length L2 was fixed to 54 mm, which corresponds to the length of five apertures 202A arranged.

When the length L1 was 10 mm, which corresponds to the length of the side of one aperture 202A, a noise reduction effect of about 2 dB was obtained. When the length L1 was 32 mm, which corresponds to the length of the sides of three apertures 202A, a noise reduction effect of about 5 dB was obtained. As the length L1 of the aperture forming portion 210A was changed to a greater value, when the length L1 was 98 mm, which corresponds to the length of the sides of nine apertures 202A, the highest noise reduction effect, a noise reduction effect of about 16 dB, was obtained. Then, until the length L1 became 142 mm, a noise reduction effect of 3 dB or more was confirmed. However, as the length L1 is made longer, the leakage of electromagnetic wave noise other than the peak increases. Moreover, if the aperture area is made larger more than is necessary, the advantages of the conductive chassis 200A, such as stabilization of ground potential of the printed circuit board 300 and prevention of the influence of external noise on the printed circuit board 300, become impaired. Therefore, from the viewpoint of a noise reduction effect, it is desirable that the aperture forming portion 210A have a length in the Y-direction obtained by adding the wiring width of the signal wiring pattern 321S to the length that is 6 times or more to 20 times or less the distance between the printed wiring board 301 and the chassis 200A (the flat plate portion 201A).

Figure 8B:
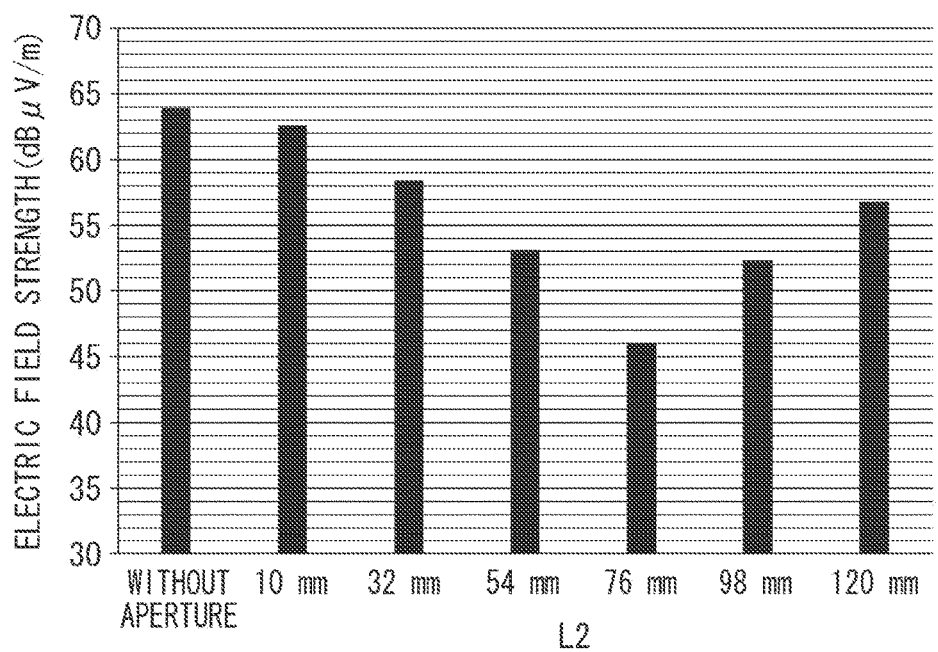
FIG. 8B is a graph indicating a simulation result of electric field strength of electromagnetic wave noise in a case where the length L2 of the aperture forming portion has been changed in Example 3.

Next, a result of calculation in a case where the length L2 of the aperture forming portion 210A was changed is illustrated in FIG. 8B. FIG. 8B is a graph illustrating a simulation result of electric field strength of electromagnetic wave noise in a case where the length L2 of the aperture forming portion 210A was changed in Example 3. The graph illustrated in FIG. 8B represents a comparison between peak values of electric field strength of electromagnetic wave noise occurring in the vicinity of 330 MHz, which is close to the basic frequency of the noise source and is a low frequency that is likely to present a problem. The length L2 was changed by changing the number of arranged apertures 202A to odd numbers, such as 1, 3, 5, . . . , in sequence. The length L1 was fixed to 54 mm, which corresponds to the length of five apertures 202A arranged.

When the length L2 was 10 mm, which corresponds to the length of the side of one aperture 202A, a noise reduction effect of about 1 dB was obtained. When the length L2 was 32 mm, which corresponds to the length of the sides of three apertures 202A, a noise reduction effect of about 6 dB was obtained. As the length L2 of the aperture forming portion 210A was changed to a greater value, when the length L2 was 76 mm, which corresponds to the length of the sides of seven apertures 202A, the highest noise reduction effect, a noise reduction effect of about 18 dB, was obtained.

However, as the length L2 is made longer, the leakage of electromagnetic wave noise other than the peak increases. Moreover, if the aperture area is made larger more than is necessary, the advantages of the conductive chassis 200A, such as stabilization of ground potential of the printed circuit board 300 and prevention of the influence of external noise on the printed circuit board 300, become impaired. Therefore, from the viewpoint of a noise reduction effect, it is desirable that the length in the X-direction of the aperture forming portion 210A be 0.75 times or more to 2 times or less the length in the X-direction of the signal wiring pattern 321S.

Figure 9:
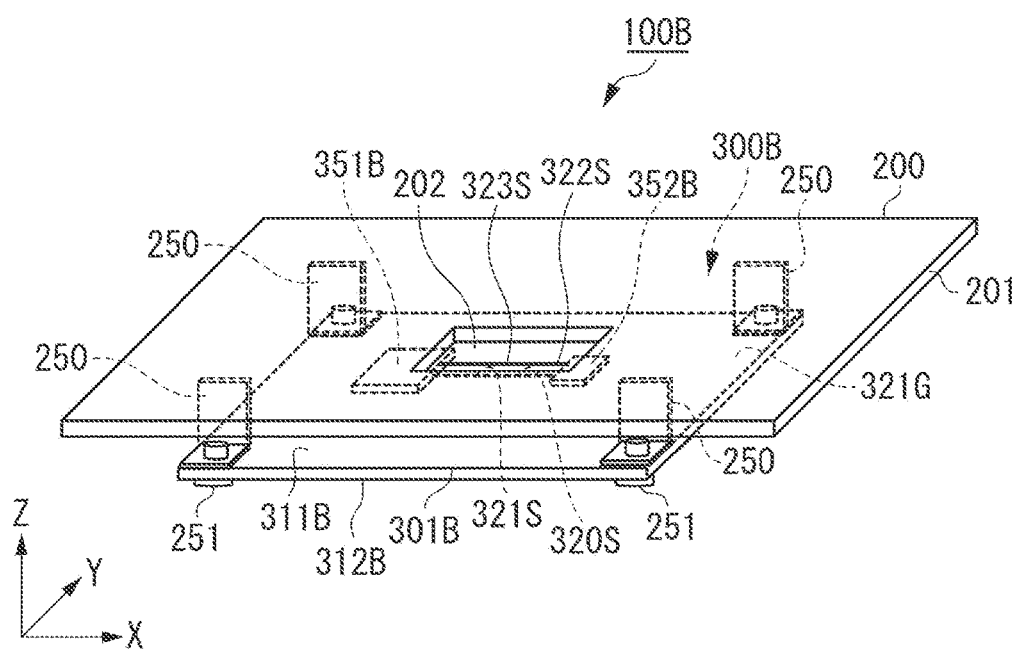
FIG. 9 is a perspective view illustrating a part of an electronic apparatus according to a third exemplary embodiment.

Next, an electronic apparatus according to a third exemplary embodiment is described. FIG. 9 is a perspective view illustrating a part of the electronic apparatus according to the third exemplary embodiment. In the third exemplary embodiment, the configuration of a printed circuit board 300B differs from that of the printed circuit board 300 described in the first exemplary embodiment. The other configurations are similar to those of the first exemplary embodiment. Furthermore, in the third exemplary embodiment, the configurations similar to those of the first exemplary embodiment are omitted from the description.

The electronic apparatus 100B includes the chassis 200 made from metal, which is a conductive member, and the printed circuit board 300B, which is located opposite the chassis 200 across a space and is fixed to the chassis 200 via the spacers 250.

The printed circuit board 300B includes a printed wiring board 301B, a semiconductor device (IC) 351B, which is a first semiconductor device, mounted on the printed wiring board 301B, and a semiconductor device (IC) 352B, which is a second semiconductor device, mounted on the printed wiring board 301B.

The printed wiring board 301B is a printed wiring board configured with two or more layers, which include a pair of surficial layers 311B and 312B. The semiconductor devices 351B and 352B are mounted on one surficial layer 311B of the printed wiring board 301B. The surficial layer 311B is a surficial layer located opposite (fixed to) the chassis 200.

The printed wiring board 301B has a signal wiring 320S formed thereon, which is used for connecting a signal terminal (output terminal) of the semiconductor device 351B and a signal terminal (input terminal) of the semiconductor device 352B and serves as a transmission path for digital signals. Moreover, the printed wiring board 301B has a signal wiring 322S formed thereon, which is used for connecting another signal terminal of the semiconductor device 351B and another signal terminal of the semiconductor device 352B and serves as a transmission path for digital signals. In other words, the printed wiring board 301B has a plurality of signal wirings formed thereon, used for connecting the semiconductor device 351B and the semiconductor device 352B.

The semiconductor device 351B includes an output circuit that outputs a digital signal, for example, a clock signal, to the signal wiring 320S, and the semiconductor device 352B includes an input circuit that inputs a signal output from the semiconductor device 351B to the signal wiring 320S. Moreover, the semiconductor device 351B further includes an output circuit that outputs a digital signal, for example, a control signal or a data signal, to the signal wiring 322S, and the semiconductor device 352B further includes an input circuit that inputs a signal output from the semiconductor device 351B to the signal wiring 322S. Thus, a clock signal propagates through at least one signal wiring of a plurality of signal wirings, in the third exemplary embodiment, the signal wiring 320S.

A signal wiring pattern 321S, which constitutes the signal wiring 320S, a signal wiring pattern 323S, which constitutes the signal wiring 322S, and a ground pattern 321G, which constitutes a ground wiring, are formed on the surficial layer 311B. Furthermore, although not illustrated, a power-supply wiring pattern, which constitutes a power-supply wiring, is also formed on the surficial layer 311B.

In the third exemplary embodiment, the entirety of the signal wiring 320S is the signal wiring pattern 321S formed on the surficial layer 311B, and the entirety of the signal wiring 322S is the signal wiring pattern 323S formed on the surficial layer 311B. Then, the signal wiring patterns 321S and 323S are formed to extend in a linear fashion.

In the third exemplary embodiment, the flat plate portion 201 of the chassis 200 has an aperture forming portion 210, which is located opposite a signal wiring pattern of at least one of the signal wirings 320S and 322S. A single aperture 202 is formed in the aperture forming portion 210.

More specifically, since a clock signal is transmitted through the signal wiring pattern 321S, the aperture forming portion 210 is located opposite at least the signal wiring pattern 321S. In the third exemplary embodiment, the aperture forming portion 210 is also located opposite the signal wiring pattern 323S, so that the peak of electric field strength caused by resonance of electromagnetic wave noise resulting from a digital signal propagating through the signal wiring pattern 323S can also be reduced.

Furthermore, in the third exemplary embodiment, a plurality of apertures can be formed in the aperture forming portion, as in the second exemplary embodiment.

While, in the above-described exemplary embodiments, a case in which a first semiconductor device and a second semiconductor device are mounted on one surficial layer of a printed wiring board has been described, this is not limiting. A case in which one semiconductor device is mounted on one surficial layer and the other semiconductor device is mounted on the other surficial layer can also be employed. In this case, a signal wiring is configured to include, in addition to a signal wiring pattern on a surficial layer at the side opposite a conductive member, for example, a via hole and a signal wiring pattern on the other surficial layer or an inner layer. Accordingly, an aperture (aperture forming portion) only needs to be located opposite at least a signal wiring pattern on a surficial layer at the side opposite a conductive member in the signal wiring.

Figure 10A:
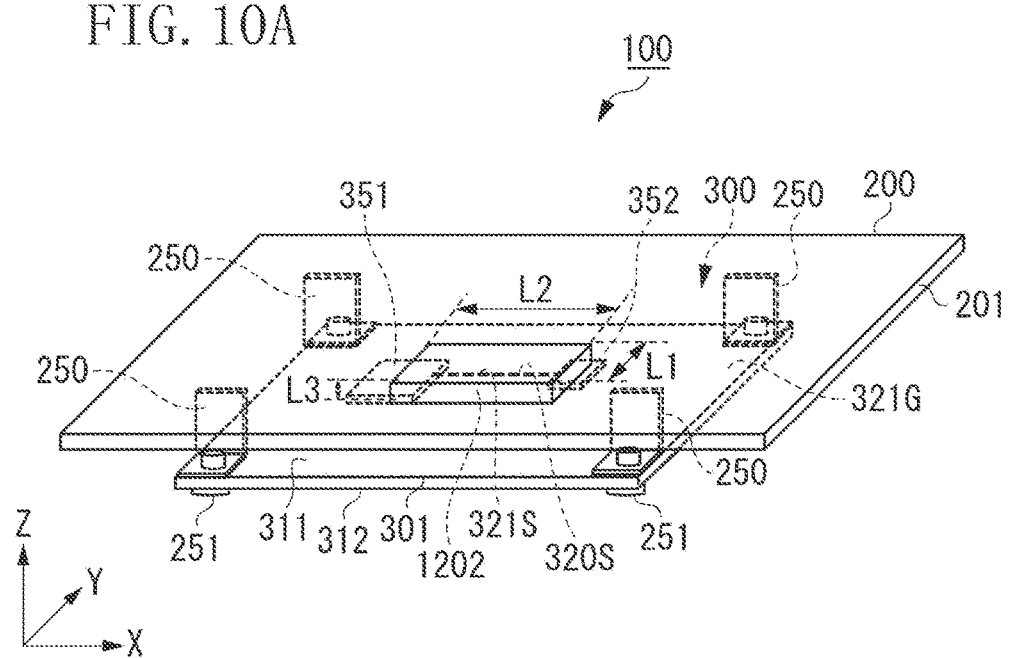
FIG. 10A is a perspective view illustrating a part of an electronic apparatus according to a fourth exemplary embodiment.
Figure 10B:
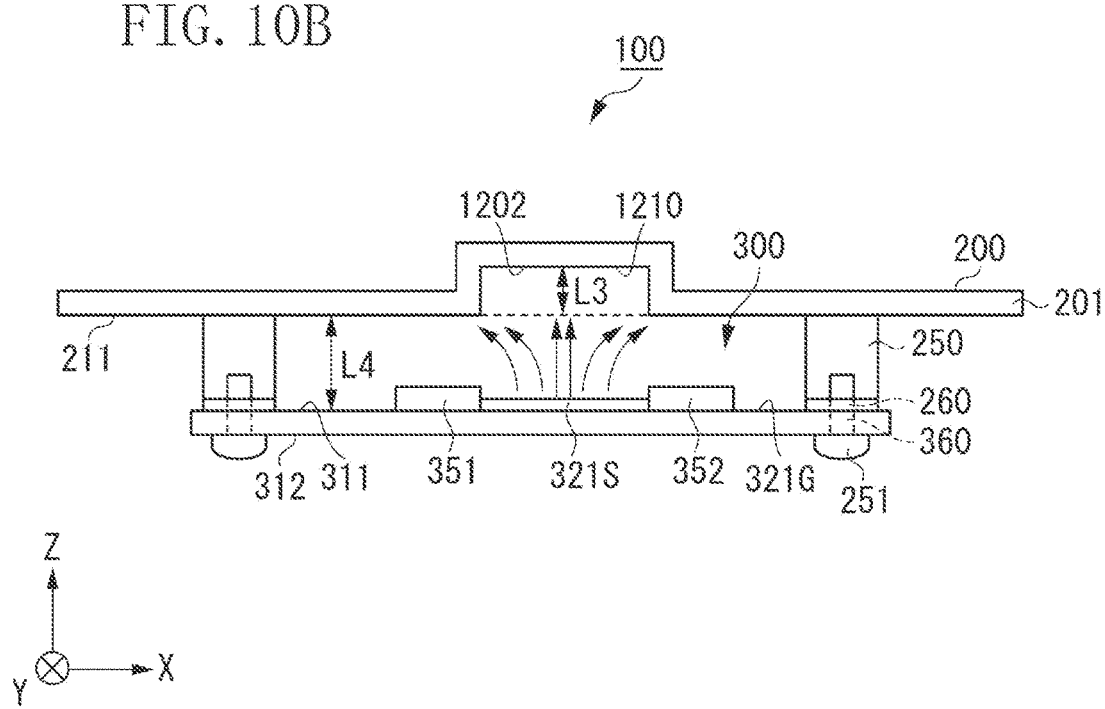
FIG. 10B is a sectional view illustrating a part of the electronic apparatus according to the fourth exemplary embodiment.

FIG. 10A is a perspective view illustrating a part of an electronic apparatus according to a fourth exemplary embodiment. FIG. 10B is a sectional view illustrating a part of the electronic apparatus according to the fourth exemplary embodiment. The electronic apparatus 100 is, for example, an image forming apparatus, such as a copying machine, and FIGS. 10A and 10B illustrate a control unit and its surrounding portion of the image forming apparatus.

The electronic apparatus 100 includes a chassis 200 made from metal, which is a conductive member, and a printed circuit board 300, which is located opposite the chassis 200 across a space and is fixed to the chassis 200 via spacers (rising portions) 250, which are conductive (metallic) connection members. More specifically, the chassis 200 has a flat plate portion 201, which is a flat plate-like member, and the printed circuit board 300 is connected to the flat plate portion 201. The printed circuit board 300 is connected to another printed circuit board (not illustrated) by a cable, so that transmission and reception of digital signals can be performed between the printed circuit boards via the cable. In the fourth exemplary embodiment, the spacers 250 are integrally attached to the chassis 200 (the flat plate portion 201).

The chassis 200 is arranged inside the electronic apparatus 100 for the purposes of positional fixing and rigidity retention of the printed circuit board 300, stabilization of ground potential of the printed circuit board 300, reduction of electromagnetic wave noise occurring in the printed circuit board 300, and reduction of the influence of external noise on the printed circuit board 300.

The printed circuit board 300 includes a printed wiring board 301, a semiconductor device (IC) 351, which is a first semiconductor device, mounted on the printed wiring board 301, and a semiconductor device (IC) 352, which is a second semiconductor device, mounted on the printed wiring board 301. The semiconductor device 351 transmits a digital signal to the semiconductor device 352, and the semiconductor device 352 receives a digital signal transmitted from the semiconductor device 351 to operate.

The printed wiring board 301 is a printed wiring board configured with two or more layers, which include a pair of surficial layers 311 and 312. The semiconductor devices 351 and 352 are mounted on one surficial layer 311 of the printed wiring board 301. The surficial layer 311 is a surficial layer located at the side opposite (fixed to) the chassis 200 (the flat plate portion 201).

The printed wiring board 301 has a signal wiring 320S formed thereon, which is used for connecting a signal terminal (output terminal) of the semiconductor device 351 and a signal terminal (input terminal) of the semiconductor device 352 and serves as a transmission path for digital signals.

The semiconductor device 351 includes an output circuit that outputs a digital signal, specifically, a clock signal, to the signal wiring 320S, and the semiconductor device 352 includes an input circuit that inputs a signal output from the semiconductor device 351 to the signal wiring 320S.

A signal wiring pattern 321S, which constitutes the signal wiring 320S, and a ground pattern 321G, which constitutes a ground wiring, are formed on the surficial layer 311. Furthermore, although not illustrated, a power-supply wiring pattern, which constitutes a power-supply wiring, is also formed on the surficial layer 311.

In the fourth exemplary embodiment, the entirety of the signal wiring 320S is the signal wiring pattern 321S formed on the surficial layer 311. Then, the signal wiring pattern 321S is formed to extend in a linear fashion.

Here, a direction which is a direction of tangent to the surface (surficial layer) 311 of the printed wiring board 301 and a wiring direction in which the signal wiring pattern 321S extends (a direction parallel to the wiring direction) is defined as the X-direction. A direction which is a direction of tangent to the surface 311 of the printed wiring board 301 and a direction perpendicular to the X-direction is defined as the Y-direction. A direction normal to the surface 311 of the printed wiring board 301 is defined as the Z-direction.

The four corners of the printed wiring board 301 are fixed to the spacers 250 by conductive screws 251. More specifically, through-holes 360 formed on the printed wiring board 301 and screw holes 260 formed on the spacers 250 are accorded with each other to enable fixing by the screws 251.

Ground patterns 321G are formed at least at the four corners of the surficial layer 311 of the printed wiring board 301, and the ground patterns 321G are electrically connected to the chassis 200 by the spacers 250. In other words, the printed circuit board 300 is grounded via the chassis 200 by the spacers 250.

Then, in the fourth exemplary embodiment, the chassis 200 includes a recessed-portion forming portion 1210 which is located at the flat plate portion 201 and in which a recessed portion 1202 that is located opposite the signal wiring pattern 321S and is recessed in a direction more away from the printed wiring board 301 than the flat plate portion 201 is formed. Thus, the recessed portion 1202 is formed on a surface 211 of the flat plate portion 201 at the side opposite the surficial layer (upper surface) 311 of the printed wiring board 301.

While, in the fourth exemplary embodiment, a single recessed portion 1202 is formed in the recessed-portion forming portion 1210, a plurality of recessed portions can be formed at intervals from each other. The recessed-portion forming portion 1210 is a convex polygon with a minimum area encompassing all of the recessed portions 1202 as viewed from the Z-direction, and, in the fourth exemplary embodiment, since there is only one recessed portion 1202, the recessed portion 1202 and the recessed-portion forming portion 1210 have the same size.

The four corners of the printed wiring board 301 are fixed to the flat plate portion 201 via the spacers 250. The recessed portion 1202 (the recessed-portion forming portion 1210) has a size encompassing a part or the whole, desirably the whole, of the signal wiring pattern 321S as viewed from the direction of a normal line to the surface 311 of the printed wiring board 301 (the Z-direction).

Although electromagnetic wave noise of a harmonic component of the clock signal is radiated from the signal wiring pattern 321S of the printed circuit board 300, the recessed portion 1202 of the chassis 200 causes electromagnetic field coupling to the chassis 200 to become smaller than that in the case of the comparative example in which the recessed portion 1202 is not provided.

Therefore, the amount of a harmonic component of the clock signal spreading and propagating along the flat plate portion 201 decreases, and radiation of electromagnetic wave noise caused by resonance occurring between the printed wiring board 301 and the chassis 200 is reduced. In this way, since the recessed portion 1202 is provided in the chassis 200, a uniform opposite relationship structure between the printed wiring board 301 and the chassis 200 is collapsed and the resonance is reduced, and, as a result, the amount of radiation of electromagnetic wave noise in the resonant frequency decreases.

In other words, although the total energy of electromagnetic wave noise radiated from the signal wiring pattern 321S does not decrease, the peak of electric field strength of electromagnetic wave noise occurring due to a resonance between the printed circuit board 300 and the chassis 200 can be reduced. Accordingly, the radiation of electromagnetic wave noise caused by resonance can be reduced, and the influence of electromagnetic wave noise on another electronic apparatus can be reduced.

Moreover, since the peak of electric field strength of radiated electromagnetic wave noise decreases, the printed circuit board 300 does not need to be covered with a shield box. Then, instead of a shield box, wiring of a cable connected to the printed circuit board 300 (the printed wiring board 301) becomes easy, and assembly also becomes easy.

Furthermore, while, in the fourth exemplary embodiment, a case in which the signal wiring pattern 321S is in a linear fashion has been described, a signal wiring pattern having a bent portion can also be employed. In that case, the recessed portion can be of a shape obtained by projecting the bent shape of the signal wiring pattern.

Moreover, while, in the fourth exemplary embodiment, a case in which the digital signal propagating through the signal wiring 320S is a clock signal has been described, this is not limiting. While, in the case of a clock signal, the peak of electric field strength of electromagnetic wave noise can be effectively reduced, even in the case of a digital signal other than the clock signal, for example, a digital signal serving as a control signal or a data signal, the peak of electric field strength of electromagnetic wave noise can also be reduced.

Example 4

A result of the simulated electromagnetic field calculation of electric field strength occurring at the opposite relationship structure between the printed circuit board 300 and the chassis 200 at 3 m distant position is shown to confirm the above-described function effect.

As software for electromagnetic field simulation, MW-STUDIO produced by CST Corporation was used. The flat plate portion 201 was a conductive flat plate, 310 mm long (in the X-direction) and 230 mm wide (in the Y-direction). The printed wiring board 301, 300 mm long and 210 mm wide, was located under the flat plate portion 201. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

As a noise source, a Gaussian pulse of 1 V was set in place of the semiconductor device 351 for outputting a digital signal, and a resistor of 1 MΩ was set in place of the semiconductor device 352 for inputting a digital signal. The recessed portion 1202 was a recessed portion formed in a rectangle shape as viewed from the Z-direction.

The size of the recessed portion 1202 was set to L1=40 mm, L2=60 mm, and L3=3 mm, where the length in the Y-direction was denoted by L1, the length in the X-direction was denoted by L2, and the depth (length) in the Z-direction was denoted by L3.

Figure 11:
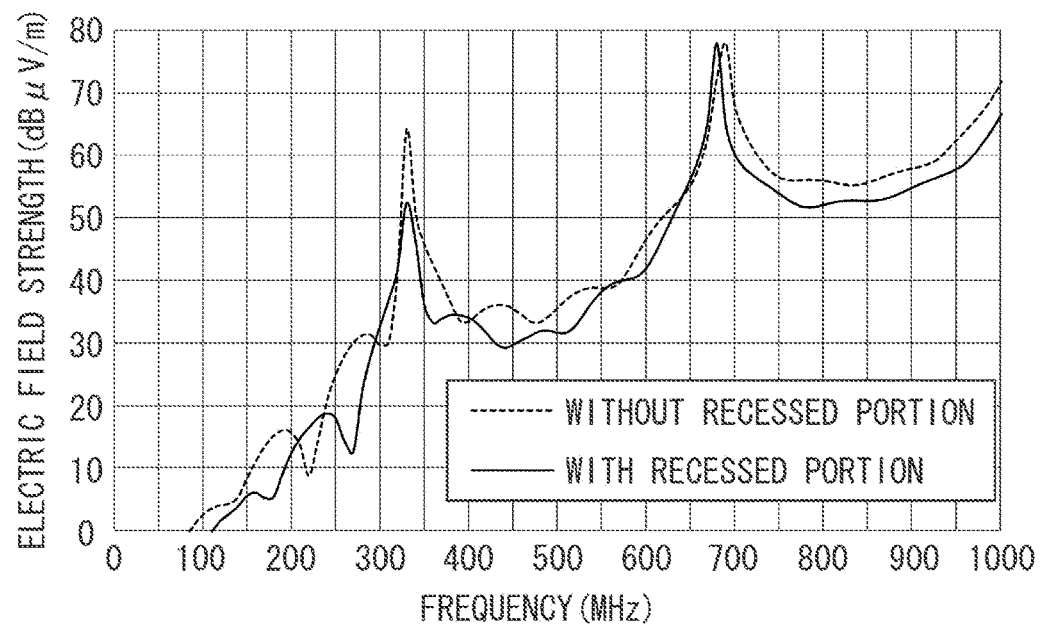
FIG. 11 is a graph indicating a simulation result of electric field strength in Example 4 and the comparative example.

FIG. 11 is a graph indicating a simulation result of electric field strength in Example 4 and the comparative example. The graph illustrated in FIG. 11 indicates a simulation result of electric field strength at a position 3 m distant from the printed circuit board 300. The abscissa axis indicates frequency, and the ordinate axis indicates electric field strength. Furthermore, in the comparative example, except for the absence of a recessed portion, the same configuration as that of Example 4 was employed to perform simulation. In FIG. 11, a solid line indicates a simulation result of Example 4 (with a recessed portion), and a dashed line indicates a simulation result of the comparative example (without any recessed portion).

The calculation (simulation) result indicates that there are peaks of electric field strength at frequencies of 330 MHz and 690 MHz, as illustrated in FIG. 11. These are electric field strength peaks caused by resonance in the opposite relationship structure between the printed circuit board 300 (the printed wiring board 301) and the chassis 200. From FIG. 11, it is understood that the peak of electric field strength is lower and the amount of radiation of electromagnetic wave noise is smaller at 330 MHz in Example 4 (with a recessed portion) than in the comparative example (without any recessed portion).

Next, calculation (simulation) results in a case where the length L1 in the Y-direction, the length L2 in the X-direction, and the length (depth) L3 in the Z-direction of the recessed portion 1202 were respectively changed are shown to confirm the effect of a decrease of the amount of radiation of electromagnetic wave noise depending on the size of the recessed portion 1202.

Figure 12A:
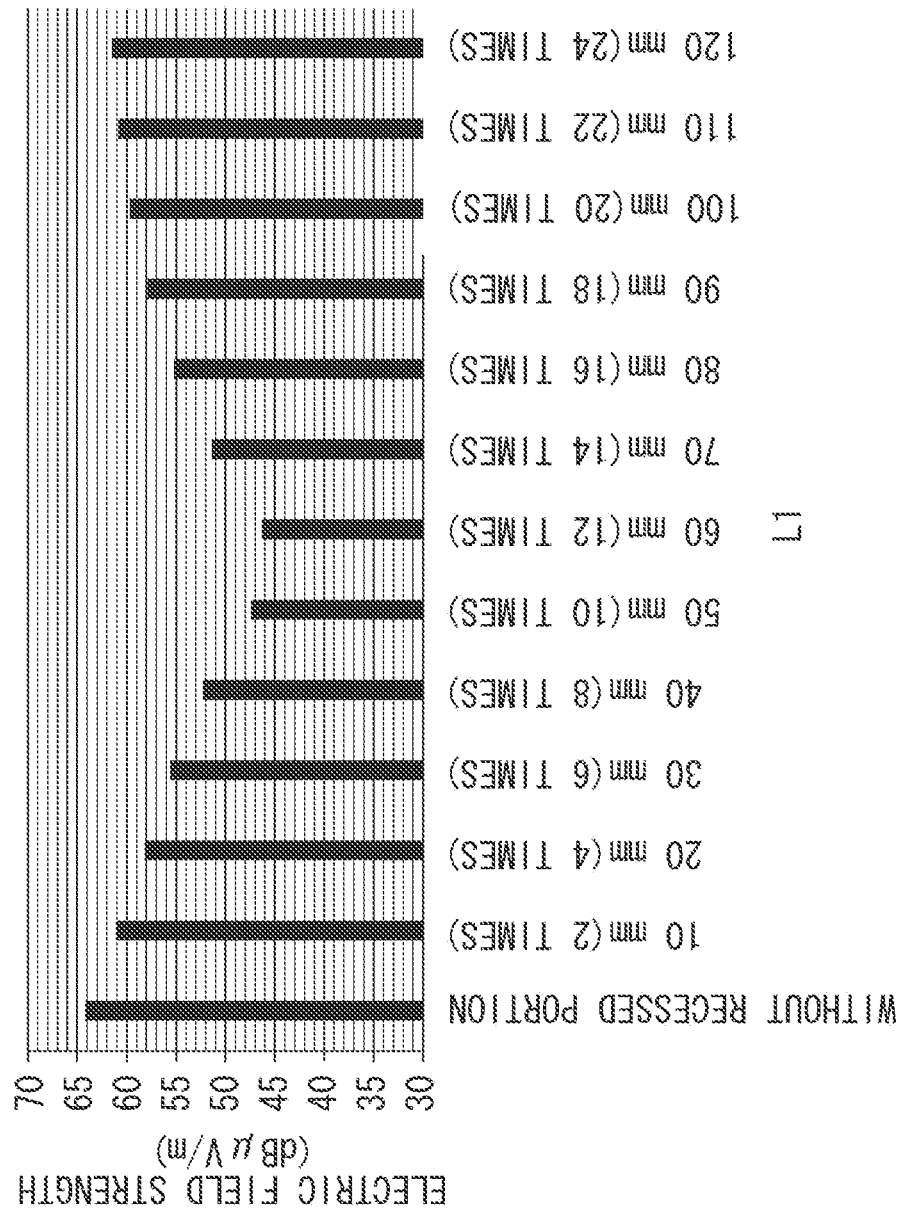
FIG. 12A is a graph indicating a simulation result of electric field strength of electromagnetic wave noise in a case where the length L1 of a recessed portion has been changed in Example 4.

First, a result of calculation in a case where the length L1 of the recessed portion 1202 was changed is illustrated in FIG. 12A. FIG. 12A is a graph illustrating a simulation result of electric field strength of electromagnetic wave noise in a case where the length L1 of the recessed portion 1202 was changed in Example 4. The graph illustrated in FIG. 12A represents a comparison between peak values of electric field strength of electromagnetic wave noise occurring in the vicinity of 330 MHz, which is close to the basic frequency of the noise source and is a low frequency that is likely to present a problem.

The width of the signal wiring pattern 321S was set to 0.2 mm, and the distance L4 between the surface (surficial layer) 311 of the printed wiring board 301 and the flat plate portion 201 was set to 5 mm. The width of the signal wiring pattern 321S was so small as to be $\frac{1}{25}$ or less of the distance L4. Therefore, without addition of 0.2 mm of the signal wiring width, the length L1 was changed to the respective even-numbered multiples of the distance L4 (5 mm) between the printed wiring board 301 and the flat plate portion 201 of the chassis 200. The length L2 was fixed to 60 mm and the length L3 was fixed to 3 mm. Moreover, the length L1 of the recessed portion 1202 was changed in the +Y-direction and in the −Y-direction from the position located opposite the central portion of the signal wiring pattern 321S.

When the length L1 was 10 mm, which was 2 times the distance L4 (5 mm), a noise reduction effect of about 3 dB was obtained. As the length L1 of the recessed portion 1202 was changed to a greater value, when the length L1 was 60 mm, which was 12 times the distance L4 (5 mm), the highest noise reduction effect, a noise reduction effect of about 18 dB, was obtained. Then, until the length L1 became 110 mm, which was 22 times the distance L4 (5 mm), a noise reduction effect of 3 dB or more was confirmed.

Therefore, from the viewpoint of a noise reduction effect of 3 dB or more, it is desirable that the recessed portion 1202 have a length L1 in the Y-direction obtained by adding the wiring width of the signal wiring pattern 321S to the length that is 2 times or more to 22 times or less the distance L4 between the printed wiring board 301 and the flat plate portion 201.

Next, a result of calculation in a case where the length L2 of the recessed portion 1202 was changed is illustrated in FIG. 12B. FIG. 12B is a graph illustrating a simulation result of electric field strength of electromagnetic wave noise in a case where the length L2 of the recessed portion 1202 was changed in Example 4. The graph illustrated in FIG. 12B represents a comparison between peak values of electric field strength of electromagnetic wave noise occurring in the vicinity of 330 MHz, which is close to the basic frequency of the noise source and is a low frequency that is likely to present a problem. The length L1 was fixed to 40 mm and the length L3 was fixed to 3 mm. Moreover, the length L2 of the recessed portion 1202 was changed in the −X-direction toward the semiconductor device 351 and in the +X-direction toward the semiconductor device 352 from the position located opposite the central portion of the signal wiring pattern 321S.

When the length L2 of the recessed portion 1202 was 10 mm, which was 0.25 times the length 40 mm of the signal wiring pattern 321S, a noise reduction effect of about 1 dB was obtained, and, when the length L2 was 20 mm, which was 0.5 times, a noise reduction effect of about 3 dB was obtained.

As the length L2 of the recessed portion 1202 was changed to a greater value, when the length L2 was 90 mm, which was 2.25 times the signal wiring length 40 mm, the highest noise reduction effect, a noise reduction effect of about 19 dB, was obtained. Then, until the length L2 became 190 mm, which was 4.75 times the signal wiring length, a noise reduction effect of 3 dB or more was confirmed.

Therefore, from the viewpoint of a noise reduction effect of 3 dB or more, it is desirable that the length in the X-direction of the recessed portion 1202 be 0.5 times or more to 4.75 times or less the length in the X-direction of the signal wiring pattern 321S.

More specifically, when the length L2 is greater than 1 times the length in the X-direction of the signal wiring pattern 321S, the recessed portion 1202 (the recessed-portion forming portion 1210) encompasses the whole of the signal wiring pattern 321S as viewed from the Z-direction. Moreover, when the length L2 is greater than 1 times the length in the X-direction of the signal wiring pattern 321S, the recessed portion 1202 (the recessed-portion forming portion 1210) encompasses a part or the whole of the semiconductor device 351 as viewed from the Z-direction. Then, when the length L2 is 2.25 times the length in the X-direction of the signal wiring pattern 321S, the recessed portion 1202 (the recessed-portion forming portion 1210) encompasses the whole of the semiconductor device 351 as viewed from the Z-direction.

In this way, the recessed portion 1202 encompassing the whole of the signal wiring pattern 321S, which serves as a radiation source of electromagnetic wave noise, as viewed from the Z-direction enables effectively reducing the amount of radiation of electromagnetic wave noise caused by resonance. Moreover, the recessed portion 1202 encompassing a part or the whole (preferably, the whole) of the semiconductor device 351 as viewed from the Z-direction enables effectively reducing the amount of radiation of electromagnetic wave noise caused by resonance.

Furthermore, in Example 4, with respect to the semiconductor device 352, which is a receiving side, the recessed portion 1202 (the recessed-portion forming portion 1210) encompasses a part or the whole of the semiconductor device 352 as viewed from the Z-direction. This enables effectively reducing the amount of radiation of electromagnetic wave noise caused by resonance.

Next, a result of calculation in a case where the length L3 of the recessed portion 1202 was changed is illustrated in FIG. 12C. FIG. 12C is a graph illustrating a simulation result of electric field strength of electromagnetic wave noise in a case where the length L3 of the recessed portion 1202 was changed in Example 4. The graph illustrated in FIG. 12C represents a comparison between peak values of electric field strength of electromagnetic wave noise occurring in the vicinity of 330 MHz, which is close to the basic frequency of the noise source and is a low frequency that is likely to present a problem. The length L1 was fixed to 40 mm and the length L2 was fixed to 60 mm.

When the length L3 of the recessed portion 1202 was 1 mm, which was 0.2 times the distance L4 (5 mm) between the printed wiring board 301 and the flat plate portion 201 of the chassis 200, a noise reduction effect of about 4 dB was obtained.

As the depth (length) L3 of the recessed portion 1202 was changed to a greater value, when the depth L3 was 8 mm, which was 1.6 times the distance L4 (5 mm), the highest noise reduction effect, a noise reduction effect of about 23 dB, was obtained. Moreover, even when the depth L3 was changed to a further greater value, the noise reduction effect showed little change. Therefore, from the viewpoint of the size of the chassis 200 and a noise reduction effect of 3 dB or more, it is desirable that the depth L3 of the recessed portion 1202 be 0.2 times or more to 1.6 times or less the distance L4.

Figure 13A:
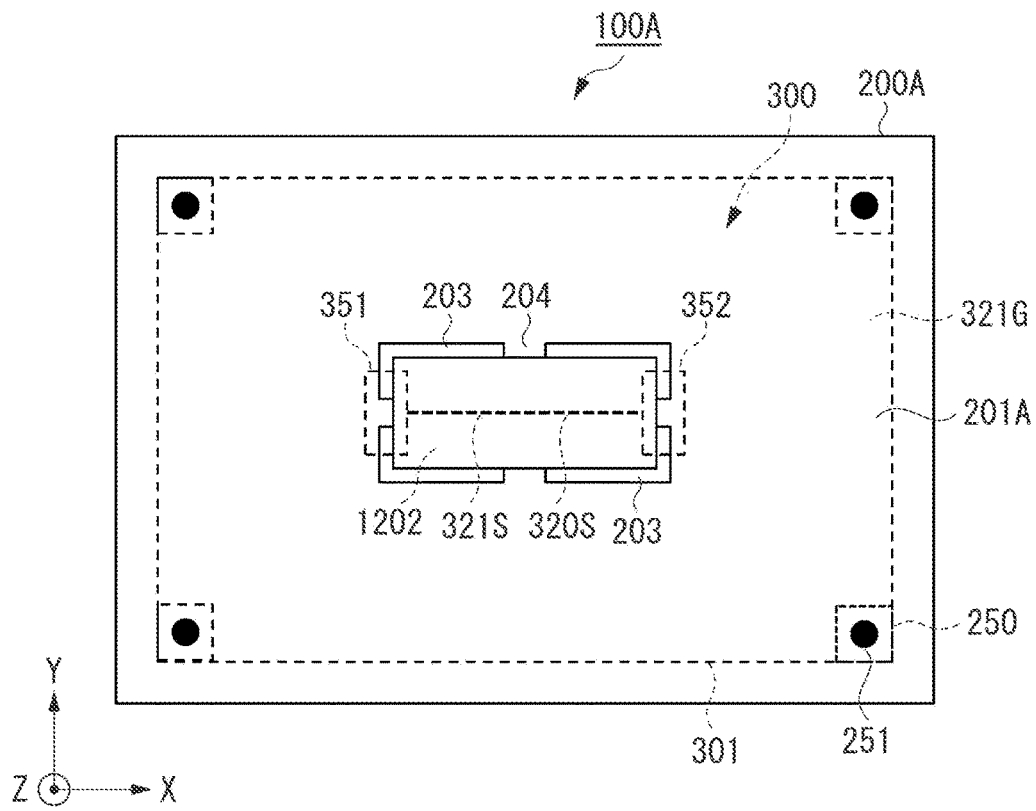
FIG. 13A is a plan view illustrating a part of an electronic apparatus according to a fifth exemplary embodiment.
Figure 13B:
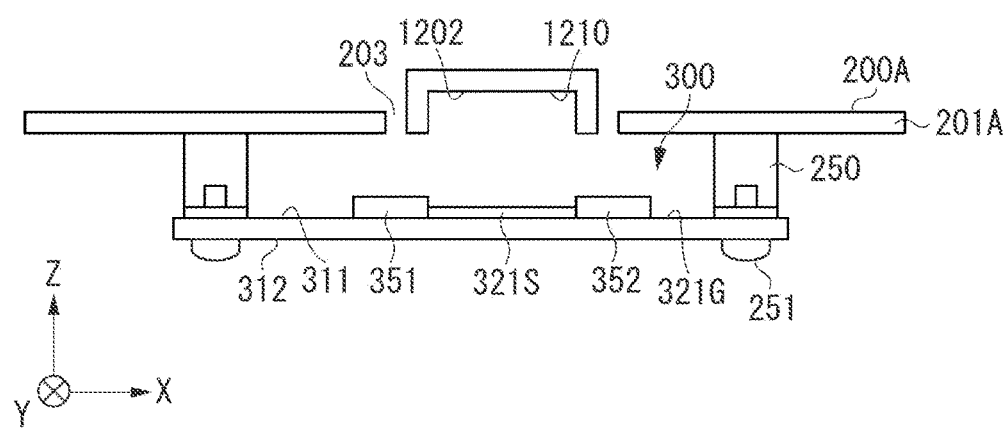
FIG. 13B is a sectional view illustrating a part of the electronic apparatus according to the fifth exemplary embodiment.

Next, an electronic apparatus according to a fifth exemplary embodiment is described. FIG. 13A is a plan view illustrating a part of the electronic apparatus according to the fifth exemplary embodiment. FIG. 13B is a sectional view illustrating a part of the electronic apparatus according to the fifth exemplary embodiment. In the fifth exemplary embodiment, the configuration of a chassis 200A, which is a conductive member, differs from that of the chassis 200 described in the fourth exemplary embodiment. The other configurations are similar to those of the fourth exemplary embodiment. Furthermore, in the fifth exemplary embodiment, the configurations similar to those of the fourth exemplary embodiment are omitted from the description.

The electronic apparatus 100A includes the chassis 200A made from metal, which is a conductive member, and the printed circuit board 300, which is located opposite the chassis 200A across a space and is fixed to the chassis 200A via the spacers 250. More specifically, the chassis 200A has a flat plate portion 201A, which is a flat plate-like member, and the printed circuit board 300 is connected to the flat plate portion 201A.

The chassis 200A has a recessed-portion forming portion 1210, which is located opposite the signal wiring pattern 321S and in which a recessed portion 1202 recessed in a direction more away from the printed wiring board 301 than the flat plate portion 201A is formed.

While, in the fifth exemplary embodiment, a single recessed portion 1202 is formed in the recessed-portion forming portion 1210, a plurality of recessed portions can be formed at intervals from each other. The recessed-portion forming portion 1210 is a convex polygon with a minimum area encompassing all of the recessed portions 1202 as viewed from the Z-direction, and, in the fifth exemplary embodiment, since there is only one recessed portion 1202, the recessed portion 1202 and the recessed-portion forming portion 1210 have the same size.

The flat plate portion 201A has slits 203 formed around the recessed portion 1202 (the recessed-portion forming portion 1210). Although only one slit 203 can be formed, in the fifth exemplary embodiment, a plurality of slits 203 is formed on the flat plate portion 201A. Then, the flat plate portion 201A and the recessed portion 1202 are configured to be partially connected by connection portions 204. This configuration enables preventing electromagnetic field coupling in a harmonic component of a signal occurring between the signal wiring pattern 321S and the flat plate portion 201A. Moreover, the slits 203 enable preventing propagation of noise from the recessed portion 1202 to the flat plate portion 201A, and thus enables preventing radiation of noise from the flat plate portion 201A.

Furthermore, while, in the fifth exemplary embodiment, a case in which the signal wiring pattern 321S is in a linear fashion has been described, a signal wiring pattern having a bent portion can also be employed. In that case, the recessed portion can be of a shape obtained by projecting the bent shape of the signal wiring pattern.

Moreover, while, in the fifth exemplary embodiment, a case in which the digital signal propagating through the signal wiring 320S is a clock signal has been described, this is not limiting. While, in the case of a clock signal, the peak of electric field strength of electromagnetic wave noise can be effectively reduced, even in the case of a digital signal other than the clock signal, for example, a digital signal serving as a control signal or a data signal, the peak of electric field strength of electromagnetic wave noise can also be reduced.

Example 5

A result of the simulated electromagnetic field calculation of electric field strength occurring at the opposite relationship structure between the printed circuit board 300 and the chassis 200A at 3 m distant position is shown to confirm the above-described function effect.

As software for electromagnetic field simulation, MW-STUDIO produced by CST Corporation was used. The flat plate portion 201A was a conductive flat plate, 310 mm long and 230 mm wide. The printed wiring board 301, 300 mm long and 210 mm wide, was located under the flat plate portion 201A. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

As a noise source, a Gaussian pulse of 1 V was set in place of the semiconductor device 351 for outputting a digital signal, and a resistor of 1 MΩ was set in place of the semiconductor device 352 for inputting a digital signal. The recessed portion 1202 was a recessed portion formed in a rectangle shape as viewed from the Z-direction.

The size of the recessed portion 1202 was set to L1=40 mm, L2=60 mm, and L3=3 mm, where the length in the Y-direction was denoted by L1, the length in the X-direction was denoted by L2, and the depth (length) in the Z-direction was denoted by L3.

The flat plate portion 201A has slits 203, which are gaps with a width of 2 mm, formed at peripheral portions of the recessed portion 1202. The flat plate portion 201A and the recessed portion 1202 are connected by the connection portions 204 with a width of 2 mm at the respective middle positions of two short sides and the respective middle positions of two long sides of the recessed portion 1202.

Figure 14:
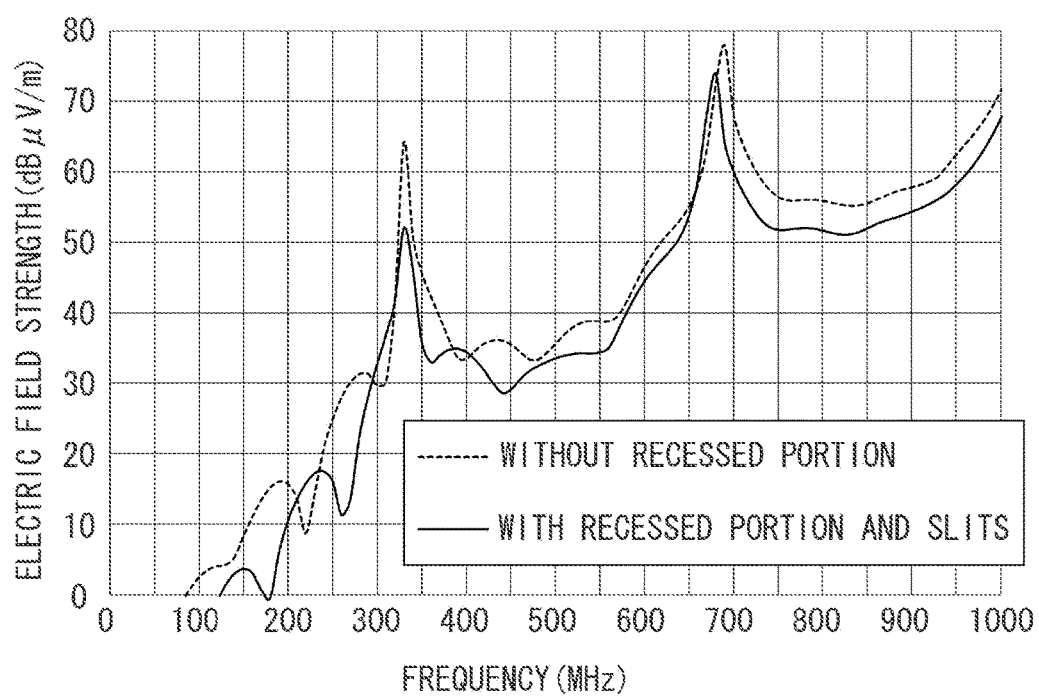
FIG. 14 is a graph indicating a simulation result of electric field strength in Example 5 and the comparative example.

FIG. 14 is a graph indicating a simulation result of electric field strength in Example 5 and the comparative example. The graph illustrated in FIG. 14 indicates a simulation result of electric field strength at a position 3 m distant from the printed circuit board 300. The abscissa axis indicates frequency, and the ordinate axis indicates electric field strength. In FIG. 14, a solid line indicates a simulation result of Example 5 (with a recessed portion and slits), and a dashed line indicates a simulation result of the comparative example (without any recessed portion and any slit).

The calculation (simulation) result indicates that there are peaks of electric field strength at frequencies of 330 MHz and 690 MHz, as illustrated in FIG. 14. These are electric field strength peaks caused by resonance in the opposite relationship structure between the printed circuit board 300 (the printed wiring board 301) and the chassis 200A. From FIG. 14, it is understood that the peak of electric field strength is lower and the amount of radiation of electromagnetic wave noise is smaller at 330 MHz in Example 5 (with a recessed portion and slits) than in the comparative example (without any recessed portion and any slits).

According to Example 5 (the fifth exemplary embodiment), forming the recessed portion 1202 and the slits 203 at the chassis 200A enables further reducing radiation of electromagnetic wave noise caused by resonance in the opposite relationship structure.

Example 6

In Example 5, a simulation was performed in a case where a Gaussian pulse was set as a noise source in place of the semiconductor device 351. In Example 6, a result of simulation performed in a case where the semiconductor device 351 output a clock signal is shown.

Figure 15A:
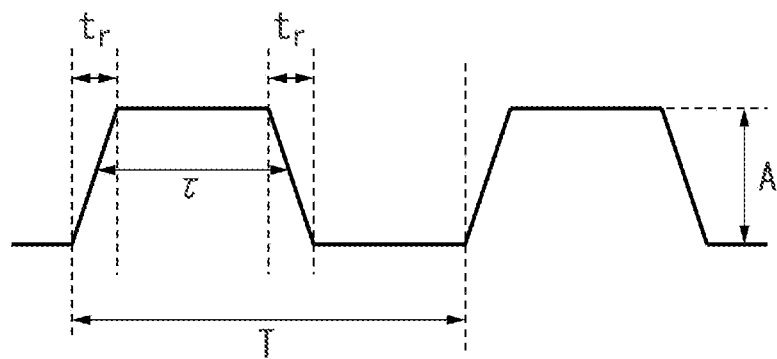
FIG. 15A is a waveform chart of a clock signal.
Figure 15B:
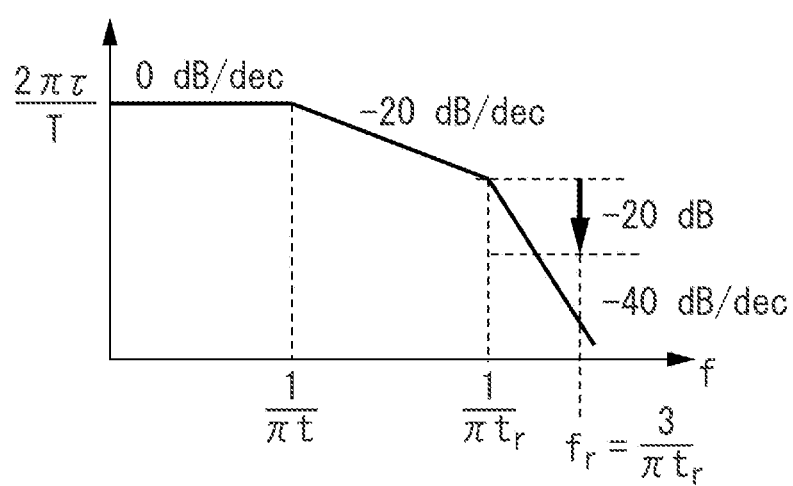
FIG. 15B is a graph indicating a frequency spectrum of the clock signal.

Here, the clock signal is described. FIG. 15A is a waveform chart of the clock signal, and FIG. 15B is a graph illustrating a frequency spectrum of the clock signal.

The clock signal is a trapezoidal wave. When the amplitude of the clock signal is denoted by A, the period thereof is denoted by T, the rise time thereof is denoted by $t_r$, and the pulse width thereof is denoted by τ, their relationship with the frequency spectrum is as illustrated in FIGS. 15A and 15B.

Here, the lowest order resonant frequency caused by the opposite relationship structure between the printed circuit board 300 (the printed wiring board 301) and the chassis 200A is denoted by $f_r$. If the resonant frequency $f_r$ is present in a region in which a harmonic component of the clock signal output from a noise source is not sufficiently reduced, the risk of electromagnetic wave noise caused by resonance becoming larger is high, so that it is necessary to prevent electromagnetic field coupling from the signal wiring pattern 321S to the chassis 200A.

Therefore, in a case where the resonant frequency $f_r$ is lower than the frequency at which the frequency spectrum reduces as much as 20 dB in a characteristic region of −40 dB/dec, the recessed portion 1202 and the slits 203 are formed in a region of the chassis 200A located opposite the signal wiring pattern 321S. The condition for that formation corresponds to the case where the rise time $t_r$ of the clock signal is in a relationship of $t_r < 3/(\pi \times f_r)$.

A result of the simulated calculation of electric field strength occurring at the opposite relationship structure between the printed circuit board 300 and the chassis 200A at 3 m distant position is shown to confirm the function effect for noise reduction.

As software for electromagnetic field simulation, MW-STUDIO produced by CST Corporation was used. The flat plate portion 201A was a conductive flat plate, 310 mm long and 230 mm wide. The printed wiring board 301, 300 mm long and 210 mm wide, was located under the flat plate portion 201A. The height of the conductive spacer 250 for grounding was 5 mm. The signal wiring pattern 321S serving as a transmission path for a digital signal was located at the central portion of the surficial layer 311 and had a length of 40 mm and a width of 0.2 mm.

Here, the lowest order resonant frequency in this example was 330 MHz, and, according to calculation of $t_r < 3/(\pi \times f_r)$, a clock signal of $t_r < 2.9$ ns was set as a target signal wiring.

The semiconductor device 351 for outputting a digital signal was configured to output a trapezoidal waveform clock signal with an amplitude of 3.3 V, a frequency of 10 MHz, and a rise time of 1 ns. The semiconductor device 352 for inputting a digital signal was configured to have a resistance value of 1 MΩ. The recessed portion 1202 was a recessed portion formed in a rectangle shape as viewed from the Z-direction.

The size of the recessed portion 1202 was set to L1=40 mm, L2=60 mm, and L3=3 mm, where the length in the Y-direction was denoted by L1, the length in the X-direction was denoted by L2, and the depth (length) in the Z-direction was denoted by L3.

The flat plate portion 201A has slits 203, which are gaps with a width of 2 mm, formed at peripheral portions of the recessed portion 1202. The flat plate portion 201A and the recessed portion 1202 are connected by the connection portions 204 with a width of 2 mm at the respective middle positions of two short sides and the respective middle positions of two long sides of the recessed portion 1202.

Figure 16:
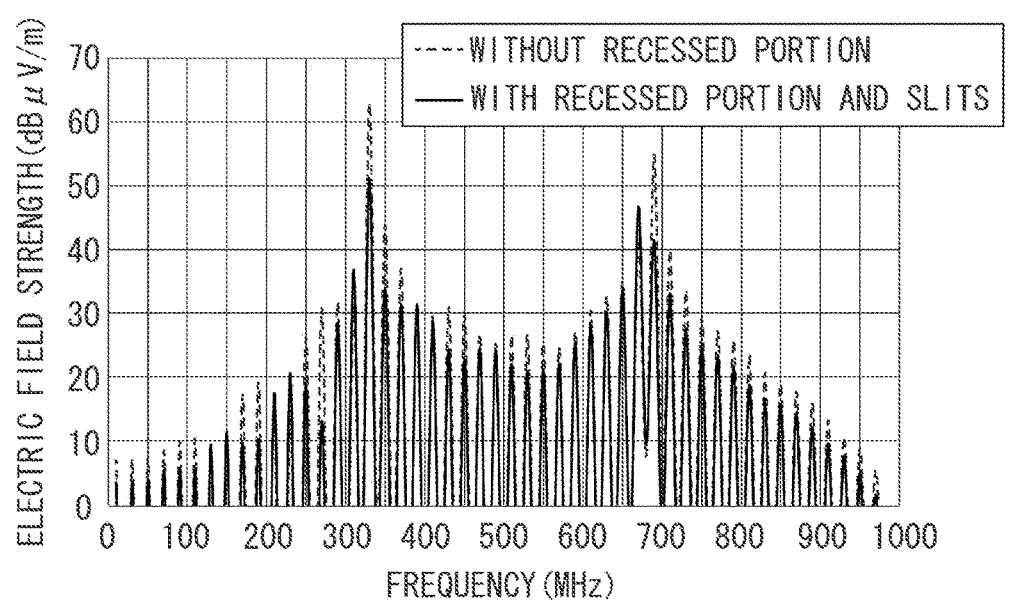
FIG. 16 is a graph indicating a simulation result of electric field strength in Example 6 and the comparative example.

FIG. 16 is a graph indicating a simulation result of electric field strength in Example 6 and the comparative example. The graph illustrated in FIG. 16 indicates a simulation result of electric field strength at a position 3 m distant from the printed circuit board 300. The abscissa axis indicates frequency, and the ordinate axis indicates electric field strength. In FIG. 16, a solid line indicates a simulation result of Example 6 (with a recessed portion and slits), and a dashed line indicates a simulation result of the comparative example (without any recessed portion and any slit).

The calculation (simulation) result indicates that there are peaks of electric field strength at frequencies of 330 MHz and 690 MHz, as illustrated in FIG. 16. These are electric field strength peaks caused by resonance in the opposite relationship structure between the printed circuit board 300 (the printed wiring board 301) and the chassis 200A.

In the low order resonant frequency of 330 MHz, since the recessed portion 1202 is applied to the signal wiring pattern 321S, through which a clock signal with a short rise time (a clock signal of 10 MHz or more) propagates, the radiation of electromagnetic wave noise in a harmonic component of the clock signal can be reduced. Moreover, in the high order resonant frequency of 690 MHz, electromagnetic wave noise can also be reduced.

While, in a case where the frequency of a clock signal is 10 MHz or more, electromagnetic wave noise can be effectively reduced, for practical purposes, the frequency of a clock signal is 1 GHz or less. Accordingly, it is desirable that the frequency of a clock signal be 10 MHz or more to 1 GHz or less.

Figure 17:
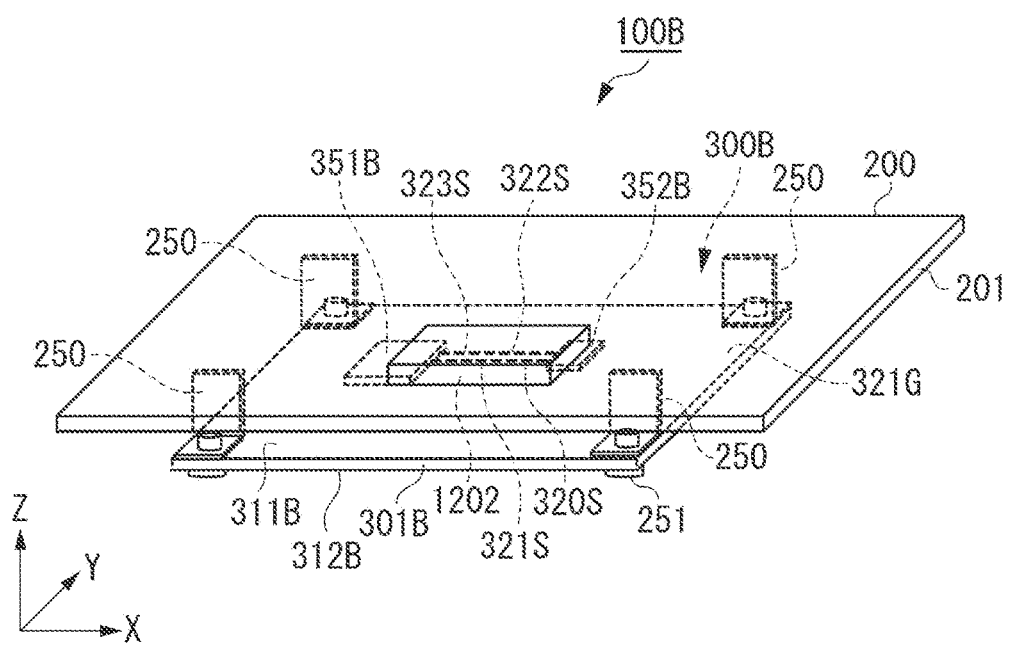
FIG. 17 is a perspective view illustrating a part of an electronic apparatus according to a sixth exemplary embodiment.

Next, an electronic apparatus according to a sixth exemplary embodiment is described. FIG. 17 is a perspective view illustrating a part of the electronic apparatus according to the sixth exemplary embodiment. In the sixth exemplary embodiment, the configuration of a printed circuit board 300B differs from that of the printed circuit board 300 described in the fourth exemplary embodiment. The other configurations are similar to those of the fourth exemplary embodiment. Furthermore, in the sixth exemplary embodiment, the configurations similar to those of the fourth exemplary embodiment are omitted from the description.

The electronic apparatus 100B includes the chassis 200 made from metal, which is a conductive member, and the printed circuit board 300B, which is located opposite the chassis 200 across a space and is fixed to the chassis 200 via the spacers 250.

The printed circuit board 300B includes a printed wiring board 301B, a semiconductor device (IC) 351B, which is a first semiconductor device, mounted on the printed wiring board 301B, and a semiconductor device (IC) 352B, which is a second semiconductor device, mounted on the printed wiring board 301B.

The printed wiring board 301B is a printed wiring board configured with two or more layers, which include a pair of surficial layers 311B and 312B. The semiconductor devices 351B and 352B are mounted on one surficial layer 311B of the printed wiring board 301B. The surficial layer 311B is a surficial layer located at the side opposite (fixed to) the chassis 200.

The printed wiring board 301B has a signal wiring 320S formed thereon, which is used for connecting a signal terminal (output terminal) of the semiconductor device 351B and a signal terminal (input terminal) of the semiconductor device 352B and serves as a transmission path for digital signals. Moreover, the printed wiring board 301B has a signal wiring 322S formed thereon, which is used for connecting another signal terminal of the semiconductor device 351B and another signal terminal of the semiconductor device 352B and serves as a transmission path for digital signals. In other words, the printed wiring board 301B has a plurality of signal wirings formed thereon, used for connecting the semiconductor device 351B and the semiconductor device 352B.

The semiconductor device 351B includes an output circuit that outputs a digital signal, for example, a clock signal, to the signal wiring 320S, and the semiconductor device 352B includes an input circuit that inputs a signal output from the semiconductor device 351B to the signal wiring 320S. Moreover, the semiconductor device 351B further includes an output circuit that outputs a digital signal, for example, a control signal or a data signal, to the signal wiring 322S, and the semiconductor device 352B further includes an input circuit that inputs a signal output from the semiconductor device 351B to the signal wiring 322S. Thus, a clock signal propagates through at least one signal wiring of a plurality of signal wirings, in the sixth exemplary embodiment, the signal wiring 320S.

A signal wiring pattern 321S, which constitutes the signal wiring 320S, a signal wiring pattern 323S, which constitutes the signal wiring 322S, and a ground pattern 321G, which constitutes a ground wiring, are formed on the surficial layer 311B. Furthermore, although not illustrated, a power-supply wiring pattern, which constitutes a power-supply wiring, is also formed on the surficial layer 311B.

In the sixth exemplary embodiment, the entirety of the signal wiring 320S is the signal wiring pattern 321S formed on the surficial layer 311B, and the entirety of the signal wiring 322S is the signal wiring pattern 323S formed on the surficial layer 311B. Then, the signal wiring patterns 321S and 323S are formed to extend in a linear fashion.

In the sixth exemplary embodiment, the chassis 200 includes the flat plate portion 201, which a flat plate-like member, and the recessed-portion forming portion 1210 (the recessed portion 1202), which is located opposite a signal wiring pattern of at least one of the signal wirings 320S and 322S.

More specifically, since a clock signal is transmitted through the signal wiring pattern 321S, the recessed-portion forming portion 1210 (the recessed portion 1202) is located opposite at least the signal wiring pattern 321S. In the sixth exemplary embodiment, the recessed-portion forming portion 1210 (the recessed portion 1202) is also located opposite the signal wiring pattern 323S, and is thus also able to reduce the peak of electric field strength caused by resonance of electromagnetic wave noise occurring due to a digital signal propagating through the signal wiring pattern 323S.

Furthermore, in the sixth exemplary embodiment, slits can also be formed on the flat plate portion 201 as in the fifth exemplary embodiment.

The present disclosure is in no way limited to the above-described exemplary embodiments, but various modifications can be implemented within the technical idea of the present disclosure. Furthermore, the advantageous effects described in the exemplary embodiments of the present disclosure are only examples of most favorable effects arising from the present disclosure, and the advantageous effects of the present disclosure are not limited to those described in the exemplary embodiments of the present disclosure.

While, in the above-described exemplary embodiments, a case in which a first semiconductor device and a second semiconductor device are mounted on one surficial layer of a printed wiring board has been described, this is not limiting. A case in which one semiconductor device is mounted on one surficial layer and the other semiconductor device is mounted on the other surficial layer can also be employed. In this case, a signal wiring is configured to include, in addition to a signal wiring pattern on a surficial layer at the side opposite a conductive member, for example, a via hole and a signal wiring pattern on the other surficial layer or an inner layer. Accordingly, a recessed portion (recessed-portion forming portion) only needs to be located opposite at least a signal wiring pattern on a surficial layer at the side opposite a conductive member, in the signal wiring.

According to exemplary embodiments of the present disclosure, radiation of electromagnetic wave noise occurring due to a resonance between a printed circuit board and a conductive member can be reduced.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2016-022100 filed Feb. 8, 2016 and No. 2016-022186 filed Feb. 8, 2016, which are hereby incorporated by reference herein in their entirety.

What is claimed is:

1. An electronic apparatus comprising:
a printed circuit board;
a conductive member, the conductive member being located opposite the printed circuit board and being configured to fix the printed circuit board in the electronic apparatus; and
at least four connecting portions, the connecting portions being configured to connect the printed circuit board to the conductive member and being separated from each other,
wherein the printed circuit board has:
a printed wiring board having a signal wiring formed thereon;
a first semiconductor device; and
a second semiconductor device connected to the first semiconductor device via the signal wiring,
wherein the signal wiring has a signal wiring pattern formed on a surficial layer located opposite the conductive member in the printed wiring board, and
wherein the conductive member has an aperture formed therein and located opposite the signal wiring pattern.

2. The electronic apparatus according to claim 1, wherein the aperture includes a plurality of apertures formed in the conductive member at intervals from each other.

3. The electronic apparatus according to claim 2,
wherein at least a part of the signal wiring pattern is formed to extend in a linear fashion, and
wherein the conductive member has an aperture forming portion in which the plurality of apertures is included, and the aperture forming portion has a length in a direction perpendicular to a wiring direction in which the signal wiring pattern extends, the length being obtained by adding a wiring width of the signal wiring pattern to a length that is 6 times or more to 20 times or less a distance between the printed wiring board and the conductive member.

4. The electronic apparatus according to claim 2,
wherein at least a part of the signal wiring pattern is formed to extend in a linear fashion, and
wherein the conductive member has an aperture forming portion in which the plurality of apertures is included, and the aperture forming portion has a length in a direction parallel to a wiring direction in which the signal wiring pattern extends, the length being 0.75 times or more to 2 times or less a length in the wiring direction of the signal wiring pattern.

5. The electronic apparatus according to claim 1, wherein the conductive member has an aperture forming portion in which the plurality of apertures is included, and the aperture forming portion encompasses an entirety of the signal wiring pattern as viewed from a direction normal to a surface of the printed wiring board.

6. The electronic apparatus according to claim 1, wherein the conductive member has an aperture forming portion in which the plurality of apertures is included, and the aperture forming portion does not encompass the first semiconductor device as viewed from a direction normal to a surface of the printed wiring board.

7. The electronic apparatus according to claim 1,
wherein the signal wiring includes a plurality of signal wirings formed on the printed wiring board, and
wherein the conductive member is located opposite the signal wiring pattern of at least one signal wiring of the plurality of signal wirings.

8. The electronic apparatus according to claim 1, wherein the digital signal transmitted through the signal wiring is a clock signal.

9. The electronic apparatus according to claim 7, wherein the digital signal transmitted through the at least one signal wiring is a clock signal.

10. The electronic apparatus according to claim 8, wherein the clock signal has a frequency of 10 MHz or more to 1 GHz or less.

11. The electronic apparatus according to claim 1, wherein the aperture is formed to reduce the electromagnetic wave noise occurring due to interference between the signal wiring pattern and the conductive member.

12. The electronic apparatus according to claim 1, wherein, in plan view, an area of the conductive member is larger than an area of the printed circuit board.

13. The electronic apparatus according to claim 1, wherein the conductive member is a chassis.

14. The electronic apparatus according to claim 1, wherein the printed circuit board is fixed to the connecting portions by conductive screws.

15. An electronic apparatus comprising:
a conductive member; and
a printed circuit board;
wherein the printed circuit board has:
a printed wiring board having a signal wiring formed thereon;
a first semiconductor device; and
a second semiconductor device connected to the first semiconductor device via the signal wiring,
wherein the signal wiring has a signal wiring pattern formed on a surficial layer located opposite the conductive member in the printed wiring board,
wherein the conductive member has an aperture forming portion in which a plurality of apertures formed therein at intervals from each other and located opposite the signal wiring pattern,
wherein at least a part of the signal wiring pattern is formed to extend in a linear fashion, and
wherein the aperture forming portion has a length in a direction perpendicular to a wiring direction in which the signal wiring pattern extends, the length being obtained by adding a wiring width of the signal wiring pattern to a length that is 6 times or more to 20 times or less a distance between the printed wiring board and the conductive member.

16. The electronic apparatus according to claim 15,
wherein at least a part of the signal wiring pattern is formed to extend in a linear fashion, and
wherein the aperture forming portion has a length in a direction parallel to the wiring direction in which the signal wiring pattern extends, the length being 0.75 times or more to 2 times or less a length in the wiring direction of the signal wiring pattern.

17. The electronic apparatus according to claim 15, wherein the aperture forming portion encompasses an entirety of the signal wiring pattern as viewed from a direction normal to a surface of the printed wiring board.

18. The electronic apparatus according to claim 15, wherein the digital signal transmitted through the signal wiring is a clock signal.

19. The electronic apparatus according to claim 18, wherein the digital signal transmitted through the at least one signal wiring is a clock signal.

20. The electronic apparatus according to claim 19, wherein the clock signal has a frequency of 10 MHz or more to 1 GHz or less.

21. An electronic apparatus comprising:
a conductive member; and
a printed circuit board;
wherein the printed circuit board has:
a printed wiring board having a signal wiring formed thereon;
a first semiconductor device; and
a second semiconductor device connected to the first semiconductor device via the signal wiring,
wherein the signal wiring has a signal wiring pattern formed on a surficial layer located opposite the conductive member in the printed wiring board,
wherein the conductive member has an aperture forming portion in which a plurality of apertures formed therein at intervals from each other and located opposite the signal wiring pattern,
wherein at least a part of the signal wiring pattern is formed to extend in a linear fashion, and
wherein the aperture forming portion has a length in a direction parallel to a wiring direction in which the signal wiring pattern extends, the length being 0.75 times or more to 2 times or less a length in the wiring direction of the signal wiring pattern.

22. The electronic apparatus according to claim 21
wherein at least a part of the signal wiring pattern is formed to extend in a linear fashion, and
wherein the aperture forming portion has a length in a direction parallel to a wiring direction in which the signal wiring pattern extends, the length being 0.75 times or more to 2 times or less a length in the wiring direction of the signal wiring pattern.

23. The electronic apparatus according to claim 21, wherein the aperture forming portion encompasses an entirety of the signal wiring pattern as viewed from a direction normal to a surface of the printed wiring board.

24. The electronic apparatus according to claim 21, wherein the digital signal transmitted through the signal wiring is a clock signal.

25. The electronic apparatus according to claim 24, wherein the digital signal transmitted through the at least one signal wiring is a clock signal.

26. The electronic apparatus according to claim 25, wherein the clock signal has a frequency of 10 MHz or more to 1 GHz or less.

* * * * *